US012787263B2

(12) United States Patent
Lee et al.

(10) Patent No.: US 12,787,263 B2
(45) Date of Patent: Nov. 3, 2026

(54) SEMICONDUCTOR DEVICE INCLUDING VERTICAL ACTIVE PILLAR

(71) Applicant: Samsung Electronics Co., Ltd., Suwon-si (KR)

(72) Inventors: Hongjun Lee, Suwon-si (KR); Keunnam Kim, Suwon-si (KR); Kiseok Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 346 days.

(21) Appl. No.: 18/435,263

(22) Filed: Feb. 7, 2024

(65) Prior Publication Data

US 2024/0276712 A1 Aug. 15, 2024

(30) Foreign Application Priority Data

Feb. 15, 2023 (KR) ........................ 10-2023-0019874

(51) Int. Cl.
*H10B 12/00* (2023.01)
*H10D 30/63* (2025.01)

(52) U.S. Cl.
CPC ........... *H10B 12/482* (2023.02); *H10D 30/63* (2025.01)

(58) Field of Classification Search
CPC ................ H10B 12/482; H10B 12/053; H10B 12/315; H10B 12/34; H10B 12/485; H10B 12/30; H10B 12/488; H10D 30/63; H10D 30/025
See application file for complete search history.

(56) References Cited

U.S. PATENT DOCUMENTS

| | | | | |
|---|---|---|---|---|
| 6,689,660 | B1 | 2/2004 | Noble et al. | |
| 7,365,385 | B2 | 4/2008 | Abbott | |
| 7,442,976 | B2 | 10/2008 | Juengling | |
| 7,482,229 | B2 | 1/2009 | Juengling | |
| 8,372,715 | B2 | 2/2013 | Chung et al. | |
| 8,552,472 | B2 | 10/2013 | Kim et al. | |
| 11,217,588 | B2 | 1/2022 | Sukekawa et al. | |
| 11,393,823 | B2 | 7/2022 | Han | |
| 2006/0043617 | A1 * | 3/2006 | Abbott | H10B 12/053 257/908 |
| 2011/0303974 | A1 * | 12/2011 | Kim | H10B 12/053 257/329 |

(Continued)

*Primary Examiner* — Shahan Ur Rahaman
(74) *Attorney, Agent, or Firm* — Harness, Dickey & Pierce, P.L.C.

(57) ABSTRACT

A semiconductor device may include a substrate, a bit line structure, first and second gate electrodes spaced apart from each other, and first and second gate dielectric layers. The substrate may include a first upper active region and a second upper active region spaced apart from each other and protruding upwardly from a lower active region, a first vertical active pillar protruding upwardly from the first upper active region, and a second vertical active pillar protruding upwardly from the second upper active region. The bit line structure may be between the first and second upper active regions. The first and second gate electrodes respectively may surround channel regions of the first and second vertical active pillars. First and second gate dielectric layers respectively may be between the first vertical active pillar and the first gate electrode and between the second vertical active pillar and the second gate electrode.

20 Claims, 29 Drawing Sheets

(56) References Cited

U.S. PATENT DOCUMENTS

| | | | | |
|---|---|---|---|---|
| 2012/0156844 | A1* | 6/2012 | Kim | H10B 12/34 438/270 |
| 2017/0301569 | A1* | 10/2017 | Lee | H10B 12/485 |
| 2021/0074705 | A1 | 3/2021 | Tang et al. | |
| 2022/0059535 | A1 | 2/2022 | Sukekawa | |
| 2022/0076732 | A1* | 3/2022 | Kang | G11C 5/025 |
| 2022/0139443 | A1 | 5/2022 | Kim et al. | |

* cited by examiner

SEMICONDUCTOR DEVICE INCLUDING VERTICAL ACTIVE PILLAR

CROSS-REFERENCE TO RELATED APPLICATION(S)

This application claims benefit of priority to Korean Patent Application No. 10-2023-0019874, filed on Feb. 15, 2023 in the Korean Intellectual Property Office, the disclosure of which is incorporated herein by reference in its entirety.

BACKGROUND

Example embodiments relate to a semiconductor device including a vertical active pillar and/or a method of manufacturing the same.

Research is being conducted, aimed at reducing the size of elements constituting a semiconductor device and improving performance thereof. For example, in a DRAM, research is being conducted to reliably and stably form elements with reduced sizes.

SUMMARY

Example embodiments provide a semiconductor device having an increased degree of integration.

Example embodiments provide a semiconductor device having improved performance.

Example embodiments provide a method for forming the semiconductor device having an increased degree of integration and improved performance.

According to example embodiments, a semiconductor device may include a substrate including a lower active region, a first upper active region and a second upper active region protruding upwardly from the lower active region, a first vertical active pillar protruding upwardly from the first upper active region, and a second vertical active pillar protruding upwardly from the second upper active region; a bit line structure between the first upper active region and the second upper active region; a first gate electrode surrounding a side surface of a channel region of the first vertical active pillar; a second gate electrode surrounding a side surface of a channel region of the second vertical active pillar, the second gate electrode being spaced apart from the first gate electrode; a first gate dielectric layer between the first vertical active pillar and the first gate electrode; and a second gate dielectric layer between the second vertical active pillar and the second gate electrode. The first upper active region and the second upper active region may be spaced apart from each other.

According to example embodiments, a semiconductor device may include a substrate, the substrate including a first vertical active pillar and a second vertical active pilar; a bit line structure at a first height level on the substrate, the bit line structure extending in a first direction; and a word line structure at a second height level on the substrate, the word line structure extending in a second direction, the second height level being higher than the first height level. The first vertical active pillar and the second vertical active pillar may be spaced apart from each other in the second direction on the substrate. The word line structure may include a first gate electrode surrounding a side surface of a channel region of the first vertical active pillar, a second gate electrode surrounding a side surface of a channel region of the second vertical active pillar, and a conductive connection pattern connecting at least a portion of an upper surface of the first gate electrode and at least a portion of an upper surface of the second gate electrode. The second gate electrode may be spaced apart from the first gate electrode.

According to example embodiments, a semiconductor device may include a semiconductor substrate including a lower active region extending upwardly from the semiconductor substrate, a first upper active region and a second upper active region extending upwardly from the lower active region, a first vertical active pillar extending upwardly from the first upper active region, and a second vertical active pillar extending upwardly from the second upper active region; a bit line structure between the first upper active region and the second upper active region; a first gate electrode surrounding a side surface of a channel region of the first vertical active pillar; a second gate electrode surrounding a side surface of a channel region of the second vertical active pillar, the second gate electrode being spaced apart from the first gate electrode; a first gate dielectric layer between the first vertical active pillar and the first gate electrode; a second gate dielectric layer between the second vertical active pillar and the second gate electrode; an insulating structure including isolation regions on the semiconductor substrate and on both sides of the lower active region; shield structures on the isolation regions; a first conductive connection pattern contacting at least a portion of an upper surface of the first gate electrode; and a second conductive connection pattern contacting at least a portion of an upper surface of the second gate electrode. The first upper active region and the second upper active region may be spaced apart from each other;

BRIEF DESCRIPTION OF DRAWINGS

The above and other aspects, features, and advantages of inventive concepts will be more clearly understood from the following detailed description, taken in conjunction with the accompanying drawings, in which.

DETAILED DESCRIPTION

Hereinafter, terms such as "upper", "middle" and "lower" may be replaced with other terms, such as "first", "second" and "third" to describe the elements of the specification. Terms such as "first", "second" and "third" may be used to describe various elements, but the elements are not limited by such terms, and a "first element" may be referred to as a "second element."

Figure 1:
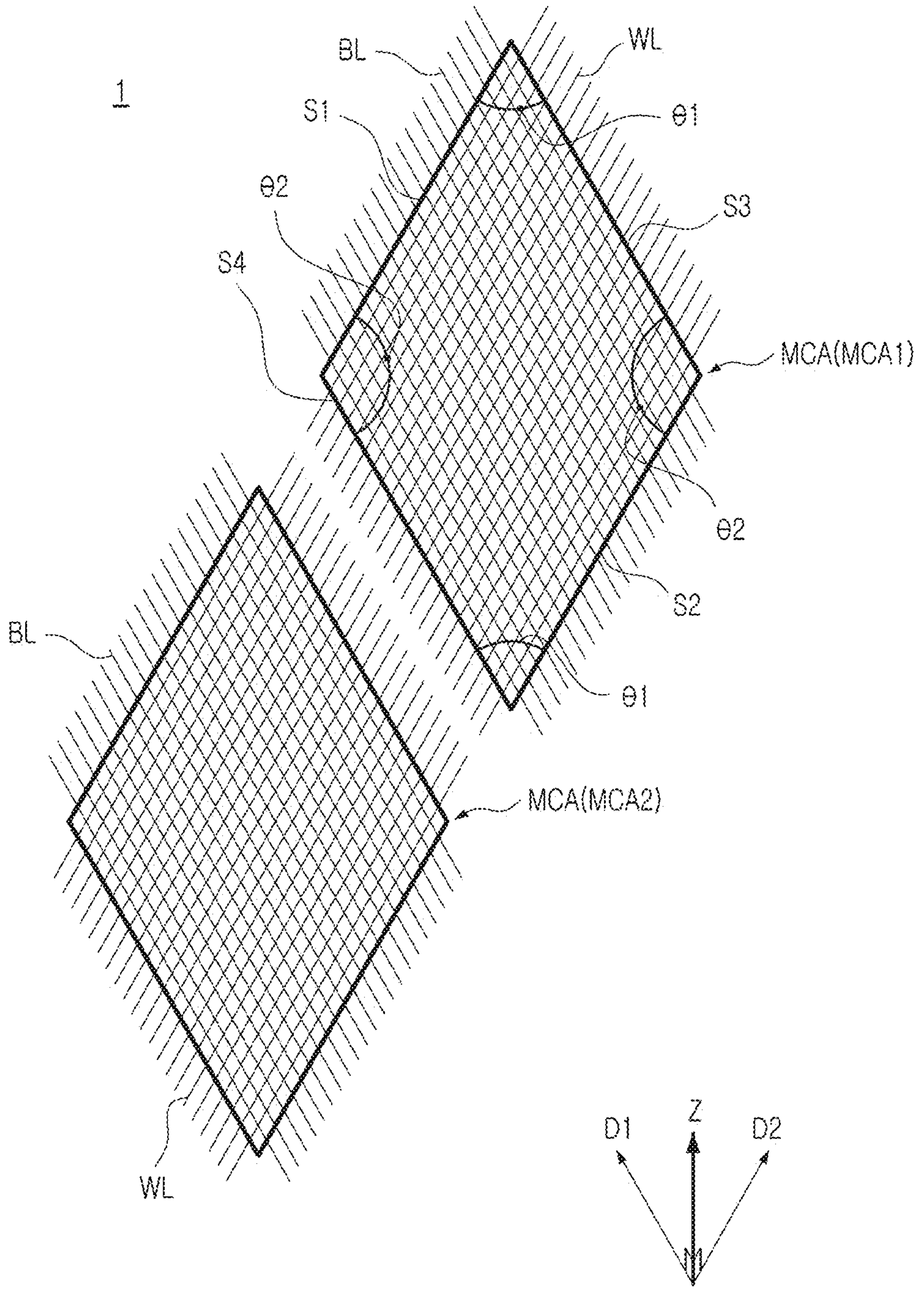
FIGS. 1, 2A, 2B, 3A, 3B, 4, 5A and 5B are the drawings conceptually illustrating an illustrative example of a semiconductor device according to an embodiment of inventive concepts.
Figure 2A:
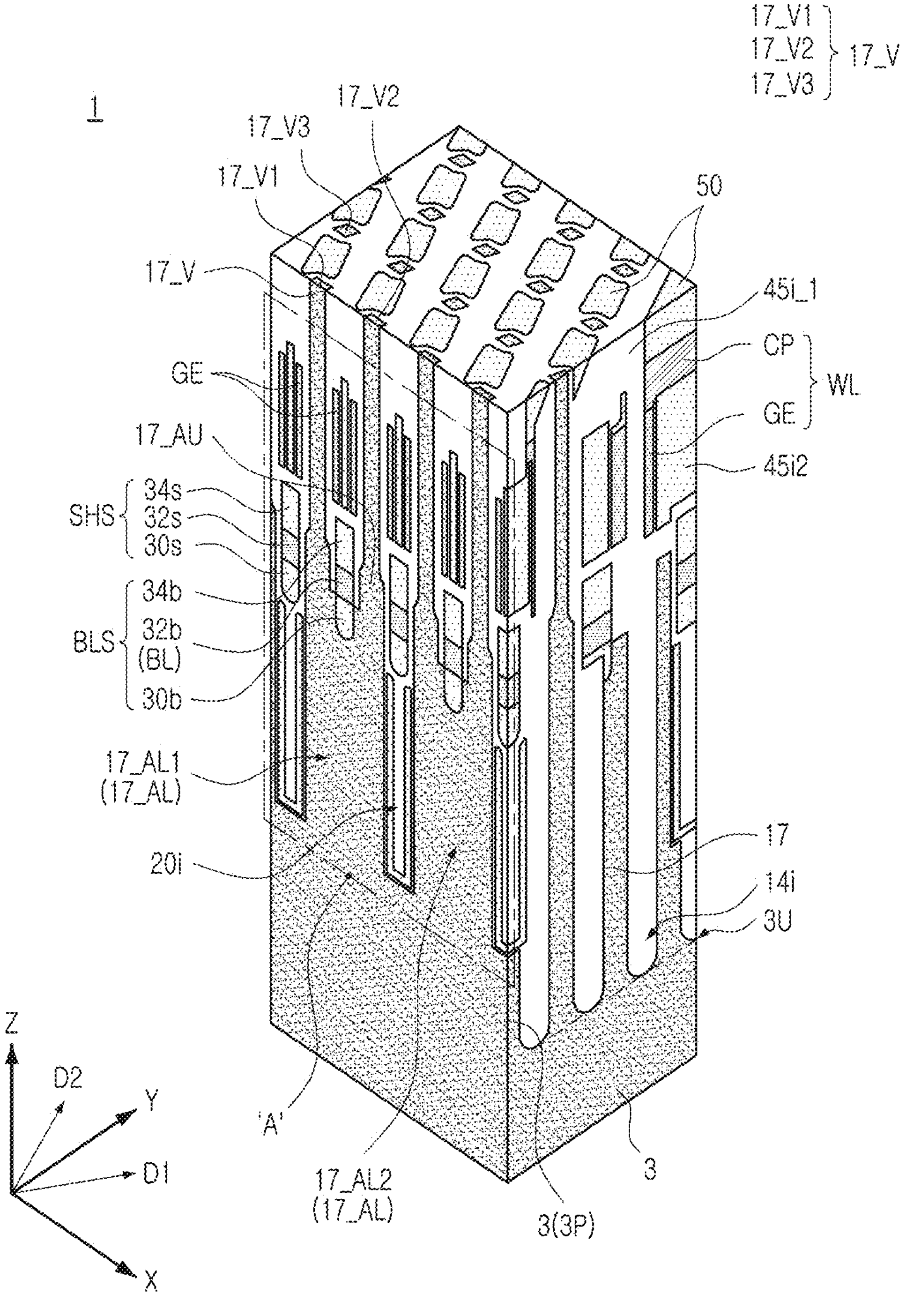
Figure 2B:
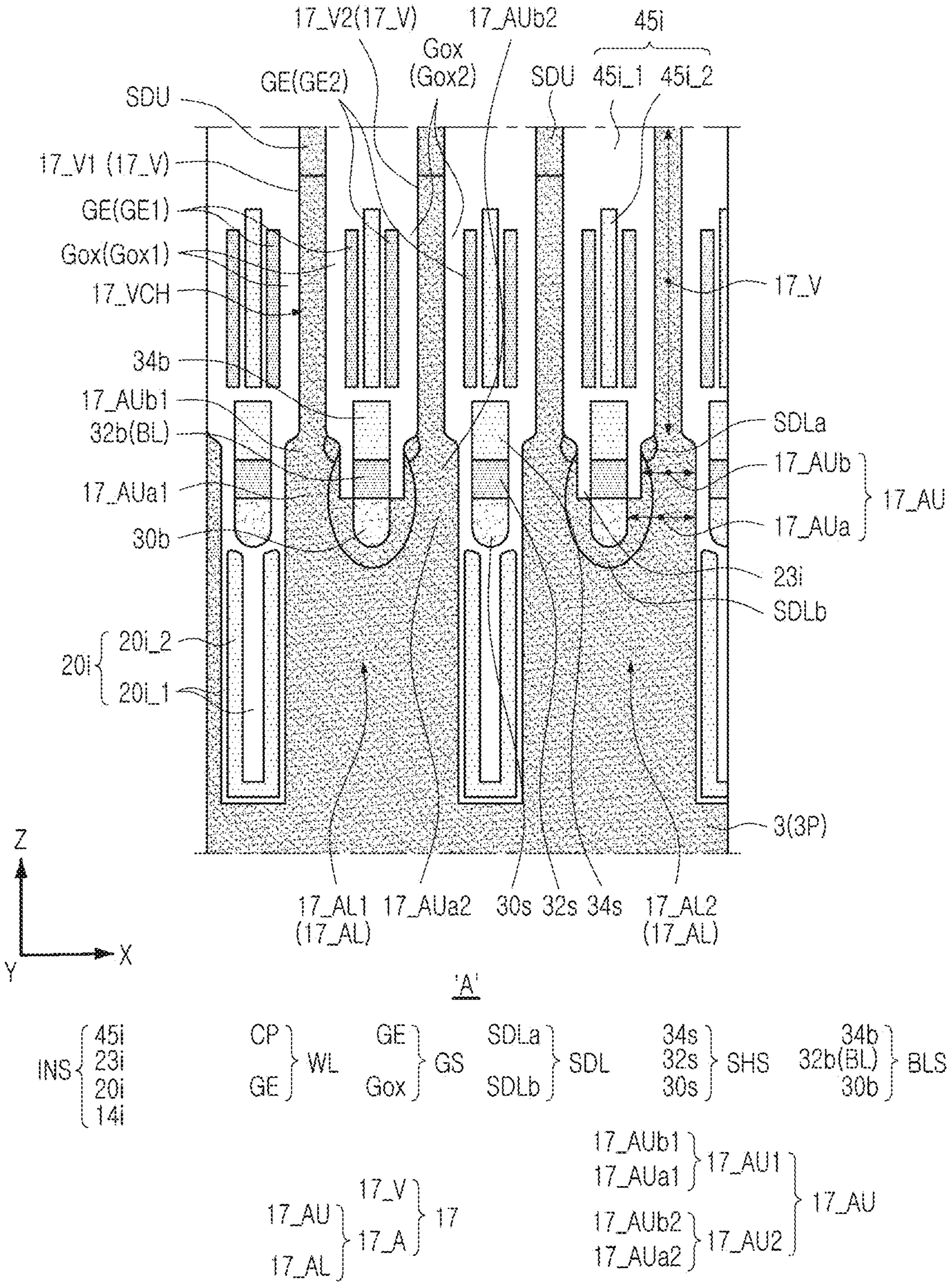
Figure 3A:
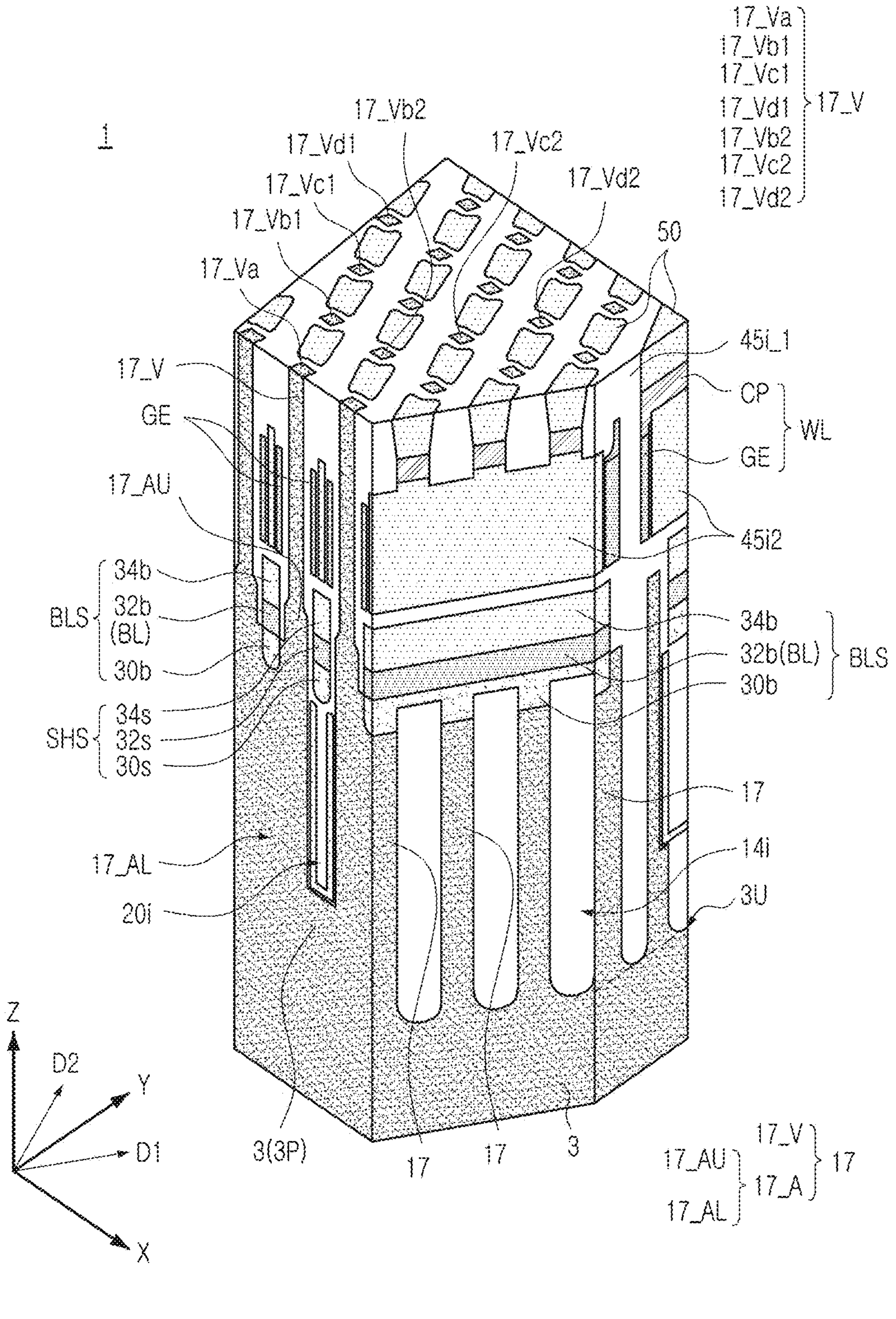
Figure 3B:
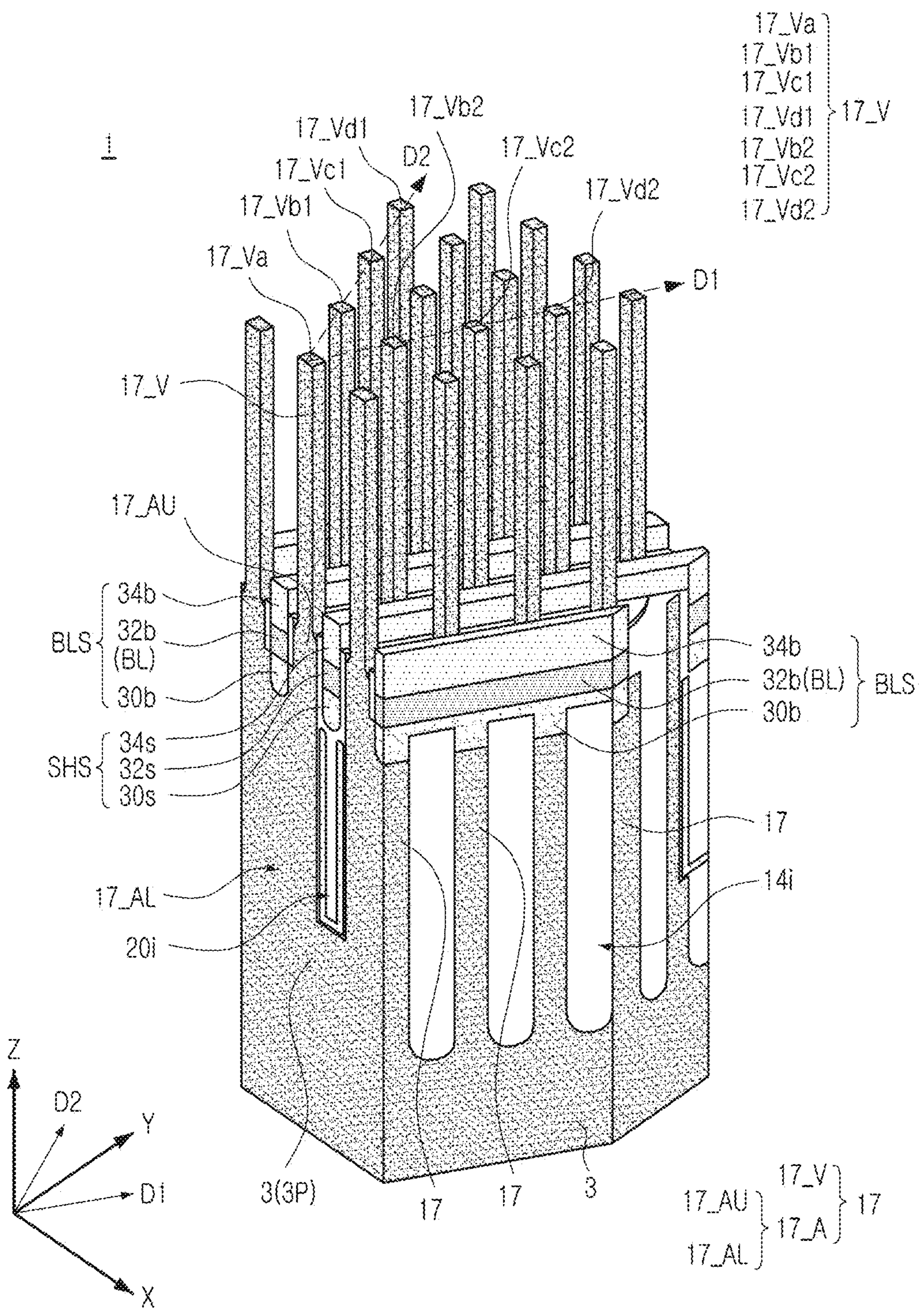
Figure 4:
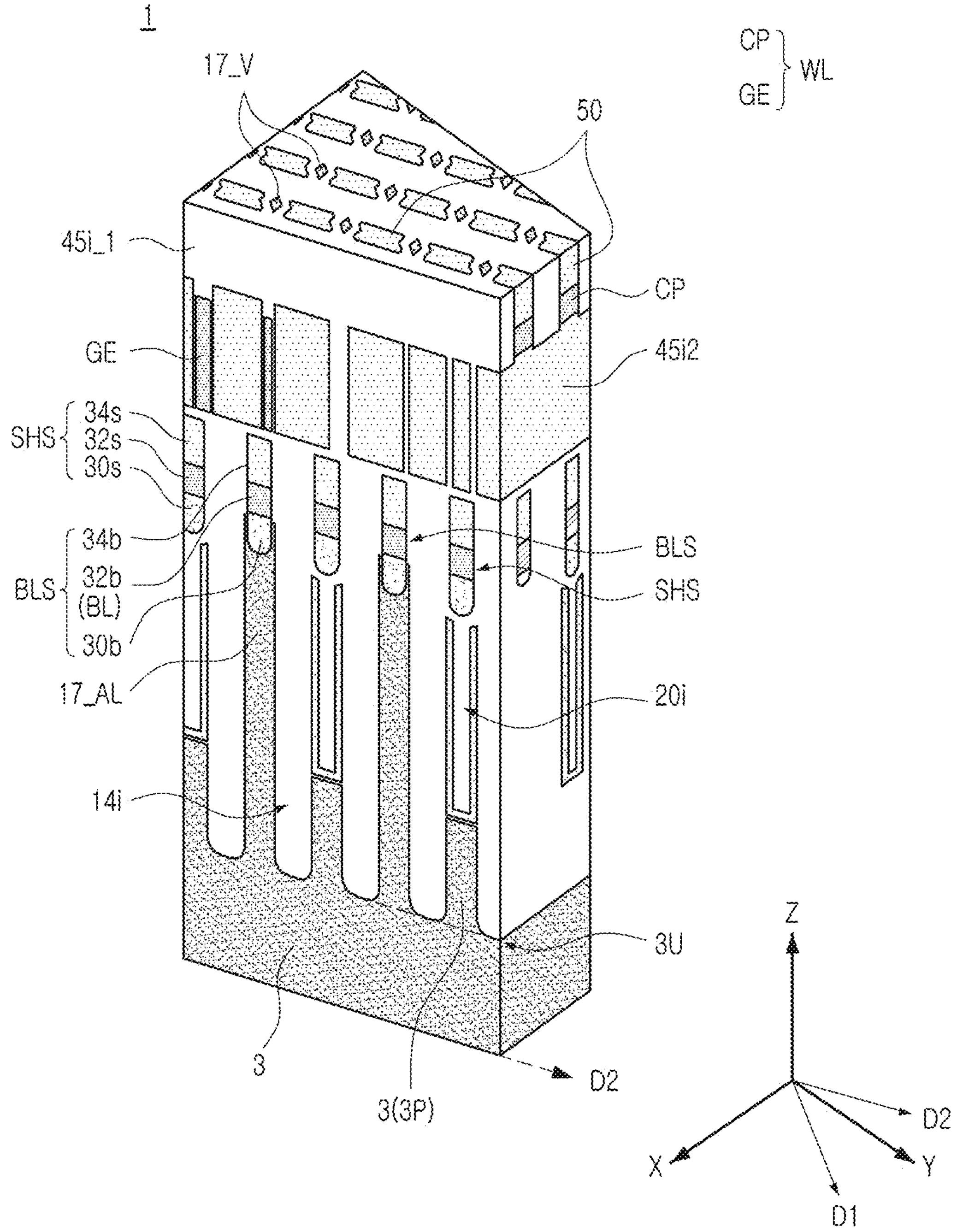
Figure 5A:
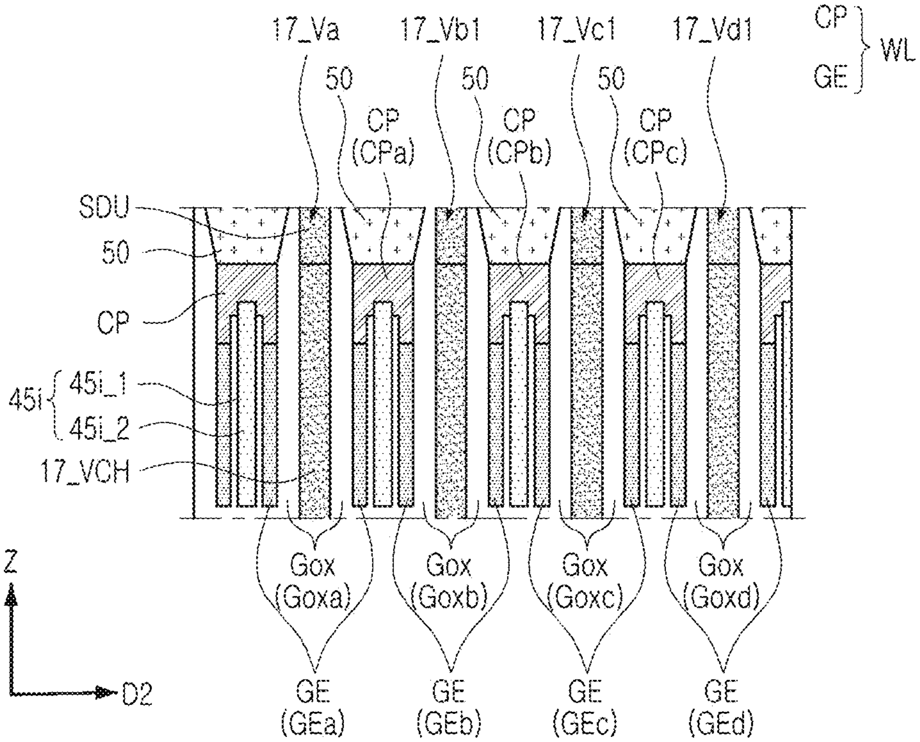
Figure 5B:
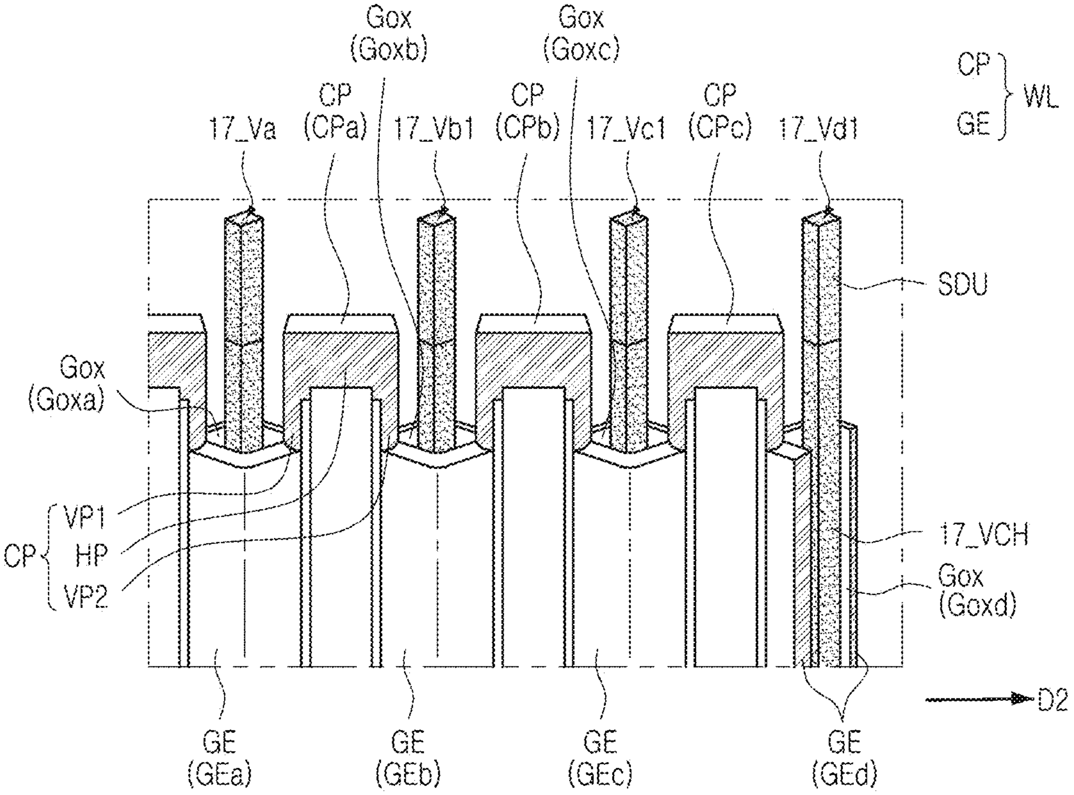

First, with reference to FIGS. 1, 2A, 2B, 3A, 3B, 4, 5A and 5B, a semiconductor device according to an embodiment of inventive concepts will be described. In FIGS. 1, 2A, 2B, 3A, 3B, 4, 5A and 5B, FIG. 1 is a top view conceptually illustrating a semiconductor device according to an embodiment of inventive concepts, FIG. 2A is a first perspective view conceptually illustrating a semiconductor device according to an embodiment of inventive concepts, FIG. 2B is a partially enlarged view enlarging a region indicated by 'A' in FIG. 2A, FIG. 3A is a second perspective view conceptually illustrating a semiconductor device according to an embodiment of inventive concepts, FIG. 3B is a perspective view of FIG. 3A with some elements omitted in order to describe vertical active pillars, FIG. 4 is a third perspective view conceptually illustrating a semiconductor device according to an embodiment of inventive concepts, FIG. 5A is a partially enlarged view conceptually illustrating a portion of a semiconductor device according to an embodiment of inventive concepts, and FIG. 5B is a partial enlarged view conceptually illustrating a portion of a semiconductor device according to an embodiment of inventive concepts.

With reference to FIGS. 1, 2A, 2B, 3A, 3B and 4, a semiconductor device 1 according to an embodiment may include memory cell array areas (MCA), and a substrate 3 and active regions 17 disposed in each of the memory cell array areas (MCA).

The substrate 3 may be a semiconductor substrate. For example, the substrate 3 may be provided as a bulk wafer, an epitaxial layer, a Silicon-On-Insulator (SOI) layer, a Semiconductor-On-Insulator (SeOI) layer, and the like. The substrate 3 may include a Group IV semiconductor, a Group III-V compound semiconductor, or a Group II-VI compound semiconductor. For example, the substrate 3 may be a substrate including at least one of silicon, silicon carbide, germanium, and silicon-germanium. For example, the substrate 3 may be a single crystal silicon substrate containing a silicon material, for example, a single crystal silicon material.

The active regions 17 may be disposed on the substrate 3. The active regions 17 may extend or protrude upwardly from the substrate 3. The active regions 17 may extend from the substrate 3 in a vertical direction Z perpendicular to an upper surface 3U of the substrate 3. The active regions 17 may be integrally formed with the substrate 3. The active regions 17 may comprise the same material as the substrate 3 adjacent to the active regions 17. For example, if the substrate 3 is a single crystal silicon substrate, the active regions 17 may comprise single crystal silicon.

The active regions 17 may include base active regions 17_A and vertical active pillars 17_V. The base active regions 17_A may include lower active regions 17_AL and upper active regions 17_AU.

Each of the active regions 17 may include one base active region 17_A, a pair of vertical active pillars 17_V protruding upwardly from the base active region 17_A and spaced apart from each other. For example, each of the base active regions 17_A may include one lower active region 17_AL, a first upper active region 17_AU1 and a second upper active region 17_AU2 protruding upwardly from the lower active region 17_AL, and spaced apart from each other, a first vertical active pillar 17_V1 protruding upwardly from the first upper active region 17_AU1, and a second vertical active pillar 17_V2 protruding upwardly from the second upper active region 17_AU2

Each of the lower active regions 17_AL may be in a bar shape extending in an X-direction. Each of the lower active regions 17_AL may include a first lower active region 17_AL1 and a second lower active region 17_AL2 adjacent to each other.

Each of the upper active regions 17_AU may include a lower portion (17_AUa in FIG. 2B) and an upper portion (17_AUb in FIG. 2B) on the lower portion (17_AUa in FIG. 2B). For example, the first upper active region 17_AU1 may include a first lower portion (17_AUa1 in FIG. 2B) and a first upper portion (17_AUb1 in FIG. 2B) on the first lower portion (17_AUa1 in FIG. 2B), and the second upper active region 17_AU2 may include a second lower portion (17_AUa2 in FIG. 2B) and a second upper portion (17_AUb2 in FIG. 2B) on the second lower portion (17_AUa2 in FIG. 2B).

In the X-direction, a width of the lower portion (17_AUa in FIG. 2B) may be greater than a width of the upper portion (17_AUb in FIG. 2B).

In the X-direction, a width of each of the vertical active pillars 17_V may be less than a width of each of the upper active regions 17_AU. In the X-direction, the width of each of the vertical active pillars 17_V may be less than a width of the upper portion (17_AUb in FIG. 2B) of each of the upper active regions 17_AU.

As shown in FIG. 2A, the vertical active pillars 17_V may include vertical active pillars (17_V1 and 17_V2 in FIG. 2A) adjacent to each other in the X-direction, and vertical active pillars (17_V1 and 17_V3 in FIG. 2A) adjacent to each other in a D2 direction. The vertical active pillars (17_V1 and 17_V2 in FIG. 2A) adjacent to each other in the X-direction may be disposed on the same lower active region 17_AL, and vertical active pillars (17_V1 and 17_V3 in FIG. 2A) adjacent to each other in the D2 direction may be disposed on the different lower active regions 17_AL.

As shown in FIGS. 3A and 3B, the vertical active pillars 17_V may include vertical active pillars 17_Va, 17_Vb1, 17_Vc1 and 17_Vd1 sequentially disposed in the D2 direction, and vertical active pillars 17_Va, 17_Vb2, 17_Vc2 and 17_Vd2 sequentially disposed in the D1 direction.

The semiconductor device 1 may further include lower source/drain regions SDL and upper source/drain regions SDU.

For one active region of the active regions 17, one lower source/drain region SDL may be disposed in the base active region 17_A, and the upper source/drain regions SDU may be disposed in an upper region of each of the first and second vertical active pillars (17_V1 and 17_V2 in FIG. 2B) protruding upwardly form the base active region 17_A and spaced apart from each other. The lower source/drain regions SDL may include first lower source/drain regions SDLa and a second lower source/drain region SDLb below the first lower source/drain regions SDLa. The first lower source/drain regions SDLa may be disposed in portions of upper regions of the upper portions 17_AUb. The second lower source/drain region SDLb may be disposed in portions of the upper regions of the upper portions 17_AUb disposed below the first lower source/drain regions SDLa, disposed in the lower portions 17_AUa, and disposed in portions of upper regions of the lower active regions 17_AL. The second lower source/drain region SDLb may have a "U" shape in the cross-sectional structure shown in FIG. 2B. The second lower source/drain region SDLb may have an impurity concentration different from that of the first lower source/drain regions SDLa. For example, the impurity concentration of the second lower source/drain region SDLb may be higher than that of the first lower source/drain regions SDLa.

The lower source/drain region SDL and the upper source/drain regions SDU may have N-type conductivity.

The semiconductor device 1 may further include first isolation regions 14*i* and second isolation regions 20*i* disposed on the substrate 3.

The first isolation regions 14*i* may separate the active regions 17 from each other in a Y-direction. Each of the first isolation regions 14*i* may have a line shape extending in the X-direction. Each of the first isolation regions 14*i* may comprise an insulating material such as a silicon oxide, a low-κ dielectric, and the like, where the low-κ dielectric may be a dielectric having a dielectric constant lower than that of a silicon oxide.

The upper surface 3U of the substrate 3 may be defined as a height level at which lower ends of the first isolation regions 14*i* are positioned.

The second isolation regions 20*i* may separate the active regions 17 from each other in a D1 direction. Each of the second isolation regions 20*i* may have a line shape extending in the D1 direction. Each of the second isolation regions 20*i* may include a "U" shaped first material layer 20*i*_1 and a second material layer 20*i*_2 covering a bottom surface, a side surface and an upper surface of the first material layer 20*i*_1. The first material layer 20*i*_1 may include an insulating material such as a silicon nitride and the like, and the second material layer 20*i*_2 may include an insulating material such as a silicon oxide, a low-κ dielectric and the like.

In one example, lower ends of the second isolation regions 20*i* may be disposed on a level higher than lower ends of the first isolation regions 14*i*. The substrate 3 may further include a substrate protruding region 3P caused by a height difference between the lower ends of the second isolation regions 20*i* and the lower ends of the first isolation regions 14*i*. The substrate protruding region 3P may be disposed below the lower active regions 17_AL and the second isolation regions 20*i*.

In another example, the lower ends of the second isolation regions 20*i* may be disposed on substantially the same level as the lower ends of the first isolation regions 14*i*. In this case, the substrate protruding region 3P of the substrate 3 may be omitted.

In embodiments, the X-direction, the Y-direction, the D1 direction, and the D2 direction may be parallel to the upper surface 3U of the substrate 3. The Y-direction may be perpendicular to the X-direction. The D1 direction may be a first oblique direction inclined with respect to the X-direction. The D2 direction may be a second oblique direction inclined with respect to the X-direction. The D1 direction and the D2 direction may be different directions from each other. The D1 direction may be an oblique direction inclined with respect to the D2 direction. For example, the D1 direction may form an acute angle with the D2 direction.

In embodiments, the D1 direction may be referred to as a first direction D1, the D2 direction may be referred to as a second direction D2, the X-direction may be referred to as a third direction X, and the Y-direction may be referred to as the fourth direction Y. Alternatively, the direction D1 may be also referred to as a first oblique direction D1, and the direction D2 may be also referred to as a second oblique direction D2.

The semiconductor device 1 may further include bit line structures BLS, gate dielectrics Gox, and word lines WL.

Each of the bit line structures BLS may have a line shape extending in the first direction D1. Each of the word lines WL may have a line shape extending in the second direction D2.

The bit line structures BLS may cross the memory cell array areas MCA in the first direction D1. The word lines WL may cross the memory cell array areas MCA in the second direction D2.

The memory cell array areas MCA may include a first memory cell array area MCA1 and a second memory cell array area MCA2 adjacent to each other in the second direction D2. Each of the memory cell array areas MCA may have first and second sides S1 and S2 opposing each other, and third and fourth sides S3 and S4 opposing each other. The first direction D1 may be a direction from the first side S1 toward the second side S2. The second direction D2 may be a direction from the third side S3 toward the fourth side S4.

The first side S1 and the third side S3 may meet each other at a first acute angle θ1, the first side S1 and the fourth side S4 may meet each other at a first obtuse angle θ2, the second side S2 and the fourth side S4 may meet each other at the first acute angle θ1, and the second side S2 and the third side S3 may meet each other at the first obtuse angle θ2. Accordingly, each of the memory cell array areas MCA may have a diamond shape.

Each of the bit line structures BLS may include a bit line contact layer 30*b* and a bit line 32*b* on the bit line contact layer 30*b*. Each of the bit line structures BLS may further include a bit line capping layer 34*b* on the bit line 32*b*. A lower surface of the bit line (32*b* in FIG. 3A) may be spaced apart from the first isolation region 14*i* by the bit line contact layer 30*b*.

The bit line contact layer (30*b* in FIG. 3A) may have a line shape extending in the first direction D1. The bit line 32*b* may have a line shape extending in the first direction D1. The bit line 32*b* may be a bit line BL of a memory device. The bit line contact layer 30*b* may be referred to as a contact layer, and the bit line 32*b* (BL) may be referred to as a conductive line.

The bit line contact layer 30*b* may comprise silicon. The bit line contact layer 30*b* may comprise N-type silicon.

In one example, the bit line contact layer 30*b* may include an N-type doped polysilicon layer.

In another example, the bit line contact layer 30*b* may include an epitaxial layer formed by an epitaxial growth process. For example, the bit line contact layer 30*b* may be formed of an N-type epitaxial silicon layer.

The bit line 32*b* (BL) may comprise at least one conductive material. The bit line 32*b* (BL) may comprise at least one of doped silicon, a metal-semiconductor compound, a metal, and a metal nitride. The bit line 32*b* (BL) may be made of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, graphene, carbon nanotubes, or a combination thereof, but is not limited thereto. The bit line 32*b* (BL) may include a single layer or multiple layers of the aforementioned materials.

The bit line capping layer 34*b* may comprise an insulating material such as a silicon nitride and the like.

Among the bit line structures BLS, the bit line structures BLS on the first lower active region (17_AL1 in FIG. 2B) will be described in detail.

In the bit line structure BLS, at least a portion of the bit line contact layer (30*b* in FIG. 2B) may be disposed between the first lower portion 17_AUa1 and the second lower portion 17_AUa2, and at least a portion of the bit line 32*b* (BL) may be disposed between the first upper portion 17_AUb1 and the second upper portion 17_AUb2. The bit line contact layer (30*b* in FIG. 2B) may contact the first lower active region 17_AL1, the first lower portion 17_AUa1, and the second lower portion 17_AUa2. The bit line 32*b* (BL) may be spaced apart from the first and second upper portions 17_AUb1 and 17_AUb2.

In one example, an upper surface of the bit line 32*b* (BL) may be disposed on a level lower than upper ends of the first and second upper portions 17_AUb1 and 17_AUb2.

In another example, the upper surface of the bit line 32*b* (BL) may be disposed on substantially the same level as the upper ends of the first and second upper portions 17_AUb1 and 17_AUb2.

In another example, the upper surface of the bit line 32*b* (BL) may be disposed on a higher level than the upper ends of the first and second upper portions 17_AUb1 and 17_AUb2.

In one example, an upper surface of the bit line capping layer 34*b* may be disposed on a level higher than the upper ends of the first and second upper portions 17_AUb1 and 17_AUb2.

In one example, in the cross-sectional structure as shown in FIG. 2B, a lower region of the bit line capping layer 34*b* may be disposed between the first and second upper portions 17_AUb1 and 17_AUb2, and an upper region of the bit line capping layer 34*b* may be disposed between the first and second vertical active pillars 17_V1 and 17_V2.

Each of the word lines WL may include a gate electrode GE and a conductive connection pattern CP connected to at least a portion of an upper surface of the gate electrode GE.

The gate electrodes GE may surround side surfaces of the vertical active pillars 17_V. The gate dielectrics Gox may be disposed between the gate electrodes GE and the vertical active pillars 17_V. The gate electrodes GE and the gate dielectrics Gox may constitute gate structures GS.

The gate electrodes GE may have a hollow pillar shape surrounding the side surfaces of the vertical active pillars 17_V. In the vertical active pillars 17_V, regions positioned at the same level as the gate electrodes GE may be defined as vertical channel regions 17_VCH. Accordingly, the gate electrodes GE, the vertical channel regions 17_VCH, the lower source/drain regions SDL, and the upper source/drain regions SDU may constitute transistors.

Each of the gate electrodes GE may comprise at least one conductive material. For example, each of the gate electrodes GE may be made of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, graphene, carbon nanotubes, or a combination thereof, but is not limited thereto. Each of the gate electrodes GE may include a single layer or multiple layers of the aforementioned materials.

The gate electrodes GE include a first gate electrode GE1 surrounding a side surface of the vertical channel region 17_VCH of the first vertical active pillar (17_V1 in FIG. 2B), and a second gate electrode GE2 surrounding a side surface of the vertical channel region 17_VCH of the second vertical active pillar (17_V2 in FIG. 2B). The gate dielectrics Gox may include a first gate dielectric Gox disposed between the first vertical active pillar (17_V1 in FIG. 2B) and the first gate electrode GE1, and a second gate dielectric Gox2 disposed between the second vertical active pillar (17_V2 in FIG. 2B) and the second gate electrode GE2.

Each of the gate dielectrics Gox may include at least one layer. Each of the gate dielectrics Gox may include at least one of a silicon oxide and a high-κ dielectric. The high-κ dielectric may be a dielectric having a dielectric constant higher than that of a silicon oxide. The high-κ dielectric may include at least one of a metal oxide and a metal oxynitride. For example, the high-κ dielectric may be made of $HfO_2$, HfSiO, HfSiON, HfTaO, HfTiO, HfZrO, $ZrO_2$, $Al_2O_3$, or a combination thereof, but is not limited thereto.

Each of the conductive connection patterns CP may include at least one conductive material. For example, each of the conductive connection patterns CP may be made of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, graphene, carbon nanotubes, or a combination thereof, but is not limited thereto. Each of the conductive connection patterns CP may include a single layer or multiple layers of the aforementioned materials.

The conductive connection patterns CP may comprise the same material as the gate electrodes GE, but the embodiments are not limited thereto. For example, the conductive connection patterns CP may comprise a material different from that of the gate electrodes GE.

The semiconductor device 1 may further include insulating capping patterns 50 on the conductive connection patterns CP.

The semiconductor device 1 may further include shield structures SHS. The shield structures SHS may be disposed on the second isolation regions 20*i*. The shield structures SHS may be disposed on the second material layers 20*i*_2 of the second isolation regions 20*i*. A side surface and a lower surface of each of the shield structures SHS may contact the second isolation region 20*i*. For example, the side surface and the lower surface of each of the shield structures SHS may contact the first material layer 20*i*_1 of the second isolation region 20*i*. The shield structures SHS may be spaced apart from the second material layers 20*i*_2 of the second isolation regions 20*i*.

At least a portion of each of the shield structures SHS may be disposed on the same level as at least a portion of each of the bit line structures BLS. The shield structures SHS may be disposed on substantially the same level as the bit line structures BLS. A width of each of the shield structures SHS may be substantially the same as a width of each of the bit line structures BLS.

The shield structures SHS may serve to screen capacitive coupling between the bit lines 32*b* (BL) adjacent to each other. For example, the shield structures SHS may reduce or block parasitic capacitance between the bit lines 32*b* (BL) adjacent to each other, so as to minimize an RC delay in the bit lines 32*b* (BL).

The upper active regions 17_AU of one of the active regions 17 may be disposed between a pair of shield structures adjacent to each other among the shield structures SHS. For example, the first and second upper active regions (17AU1 and 17AU_2 in FIG. 2B) may be disposed between the pair of shield structures SHS adjacent to each other. One of the bit line structures BLS may be disposed between the pair of shield structures SHS adjacent to each other. Accordingly, the first and second upper active regions (17AU1 and 17AU_2 in FIG. 2B) and the bit line structure BLS may be disposed between the pair of shield structures SHS adjacent to each other.

Each of the shield structures SHS may include a first shield layer 30*s* and a second shield layer 32*s* on the first shield layer 30*s*. Each of the shield structures SHS may further include a shield capping layer 34*s* on the second shield layer 32*s*.

At least a portion of the first shield layer 30*s* may be disposed on the same level as at least a portion of the bit line contact layer 30*b*. A material of the first shield layer 30*s* may be the same as that of the bit line contact layer 30*b*. At least a portion of the second shield layer 32*s* may be disposed on the same level as at least a portion of the bit line 32*b*. A material of the second shield layer 32*s* may be the same as that of the bit line 32*b*. At least a portion of the shield capping layer 34*s* may be disposed on the same level as at least a portion of the bit line capping layer 34*b*. A material of the shield capping layer 34*s* may be the same as that of the bit line capping layer 34*b*.

The semiconductor device 1 may further include an insulating region 23*i* covering side surfaces of the bit line 32*b* and the bit line capping layer 34*b*. The insulating region 23*i* may be disposed between the bit line 32*b* and the upper portions 17_AUb. For example, the insulating region 23*i* may be disposed between the bit line 32*b* (BL) and the first upper portion 17_AUb1 and between the bit line 32*b* (BL) and the second upper portion 17_AUb2. The insulating region 23*i* may be formed of an insulating material such as a silicon oxide.

The semiconductor device 1 may further include an upper insulating region 45*i* disposed on substantially the same level as the vertical active pillars 17_V. The upper insulating region 45*i* may include a first material layer 45*i*_1 and a second material layer 45*i*_2. The second material layer 45*i*_2 may be disposed between the gate electrodes GE and extend from a portion disposed between the gate electrodes GE to a level higher than the gate electrodes GE. An upper end of the second material layer 45*i*_2 may be disposed on a level lower than upper surfaces of the vertical active pillars 17_V. The first material layer 45*i*_1 may be disposed between the second material layer 45*i*_2 and the gate electrodes GE, below the gate electrodes GE and the second material layer 45*i*_2, and on the gate electrodes GE and the second material layer 45*i*_2. The first material layer 45*i*_1 may be formed of an insulating material such as a silicon oxide, and the second material layer 45*i*_2 may be formed of an insulating material such as a silicon nitride. The first isolation regions 14*i*, the second isolation regions 20*i*, the insulating regions 23*i*, and the upper insulating region 45*i* may constitute an insulating structure INS.

In FIGS. 5A and 5B, FIG. 5A is a partially enlarged cross-sectional view conceptually illustrating a cross-sectional structure in the second direction D2 of the vertical active pillars 17_Va, 17_Vb1, 17_Vc1, and 17_Vd1 sequentially arranged in the second direction D2, and FIG. 5B is a perspective view conceptually illustrating the vertical active pillars 17_Va, 17_Vb1, 17_Vc1, and 17_Vd1 sequentially arranged in the second direction D2.

In FIGS. 1 to 5B, particularly referring to FIGS. 5A and 5B, the vertical active pillars 17_Va, 17_Vb1, 17_Vc1, and 17_Vd1 sequentially arranged in the second direction D2 are referred to as a first vertical active pillar 17_Va, a second vertical active pillar 17_Vb1, a third vertical active pillar 17_Vc1, and a fourth vertical active pillar 17_Vd1. The first vertical active pillar 17_Va, the second vertical active pillar 17_Vb1, the third vertical active pillar 17_Vc1, and the fourth vertical active pillar 17_Vd1 may be sequentially arranged in the second direction D2.

The gate electrodes GE may include a first gate electrode GEa surrounding a side surface of a vertical channel region 17_VCH of the first vertical active pillar 17_Va, a second gate electrode GEb surrounding a side surface of a vertical channel region 17_VCH of the second vertical active pillar 17_Vb1, a third gate electrode GEc surrounding a side surface of a vertical channel region 17_VCH of the third vertical active pillar 17_Vc1, and a fourth gate electrode GEd surrounding a side surface of a vertical channel region 17_VCH of the fourth vertical active pillar 17_Vd1. The first to fourth gate electrodes GEa, GEb, GEc, and GEd may be sequentially arranged in the second direction D2. The first to fourth gate electrodes GEa, GEb, GEc, and GEd may be spaced apart from each other in the second direction D2.

The gate dielectrics Gox may include a first gate dielectric Goxa disposed between the first vertical active pillar 17_Va and the first gate electrode GEa, a second gate dielectric Goxb disposed between the second vertical active pillar 17_Vb1 and the second gate electrode GEb, a third gate dielectric Goxc disposed between the third vertical active pillar 17_Vc1 and the third gate electrode GEc, and a fourth gate dielectric Goxd disposed between the fourth vertical active pillar 17_Vd1 and the fourth gate electrode GEd.

The conductive connection patterns CP may contact upper surfaces of the gate electrodes GE and may be disposed on a level higher than the gate electrodes GE. The conductive connection patterns CP may be disposed on a level lower than the upper surfaces of the vertical active pillars 17_V.

The conductive connection patterns CP may include a first conductive connection pattern CPa, a second conductive connection pattern CPb, and a third conductive connection pattern CPc, sequentially arranged in the second direction D2. The conductive connection patterns CP may be spaced apart from each other.

The first conductive connection pattern CPa may electrically connect the first and second gate electrodes GEa and GEb, while contacting at least a portion of an upper surface of the first gate electrode GEa and at least a portion of an upper surface of the second gate electrode GEb. The first conductive connection pattern CPa may contact a portion of the upper surface of the first gate electrode GEa and a portion of the upper surface of the second gate electrode GEb.

The second conductive connection pattern CPb may electrically connect the second and third gate electrodes GEb and GEc, while contacting at least a portion of an upper surface of the second gate electrode GEb and at least a portion of an upper surface of the third gate electrode GEc. The second conductive connection pattern CPb may contact a portion of the upper surface of the second gate electrode GEb and a portion of the upper surface of the third gate electrode GEc.

The third conductive connection pattern CPc may electrically connect the third and fourth gate electrodes GEc and GEd, while contacting at least a portion of an upper surface of the third gate electrode GEc and at least a portion of an upper surface of the fourth gate electrode GEd. The third conductive connection pattern CPc may contact a portion of the upper surface of the third gate electrode GEc and a portion of the upper surface of the fourth gate electrode GEd.

Each of the conductive connection patterns CP may include a horizontal portion HP disposed on a level higher than the gate electrodes GE, and vertical portions VP1 and VP2 extending downwardly from the horizontal portion HP and contacting the gate electrodes GE adjacent to each other in the second direction D2. For example, the first conductive connection pattern CPa may include a horizontal portion HP disposed on a level higher than the gate electrodes GE, a first vertical portion VP1 extending downwardly from the horizontal portion HP and contacting at least a portion of the upper surface of the first gate electrode GEa, and a second vertical portion VP2 extending downwardly from the horizontal portion HP and contacting at least a portion of the upper surface of the second gate electrode GEb.

The first gate electrode GEa, the first conductive connection pattern CPa, the second gate electrode GEb, the second conductive connection pattern CPb, the third gate electrode GEc, the third conductive connection pattern CPc, and the fourth gate electrode GEd, which are sequentially arranged in the second direction D2, may constitute one word line WL. By providing the word line WL as described above, the performance of the semiconductor device 1 can be improved and the degree of integration of the semiconductor device 1 can be increased.

Hereinafter, with reference to FIGS. 6, 7, 8, 9, 10, 11 and 12, respectively, various modified examples of the elements of the embodiment described above will be described. Various modified examples of the elements of the embodiment described above will be described based on modified elements or substituted elements. Here, the elements described above may be directly referred without separate detailed explanation, or a description thereof may be omitted. Furthermore, modified or substitutable elements described below will be described with reference to the drawings below, but elements that may be deformed or substituted may be combined with each other or combined with the elements described above to form a semiconductor device according to an embodiment of the presenting inventive concept.

Figure 10:
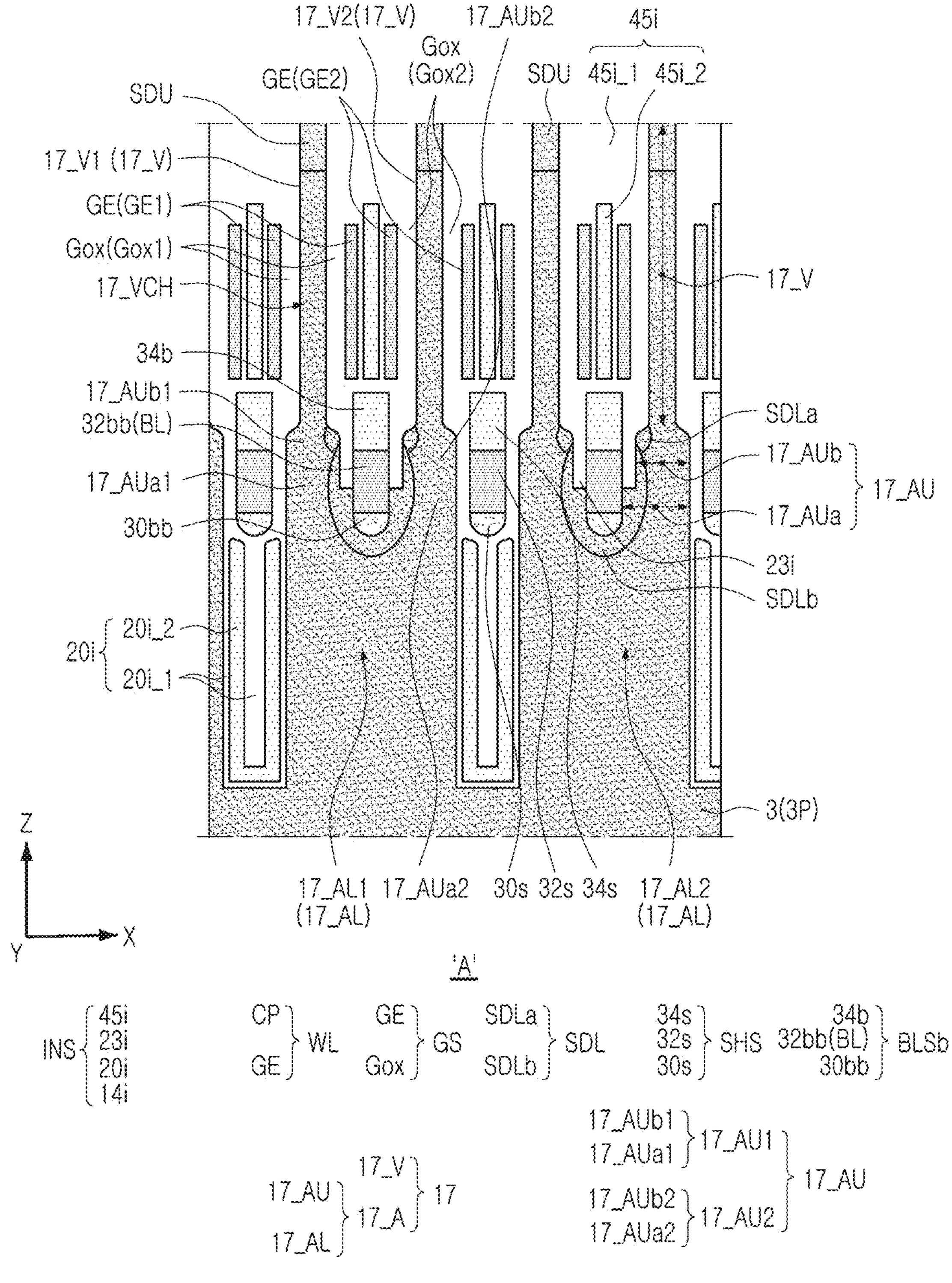
FIG. 10 is a partially enlarged cross-sectional view conceptually illustrating a variation of some elements of a semiconductor device according to an embodiment of inventive concepts.
Figure 11:
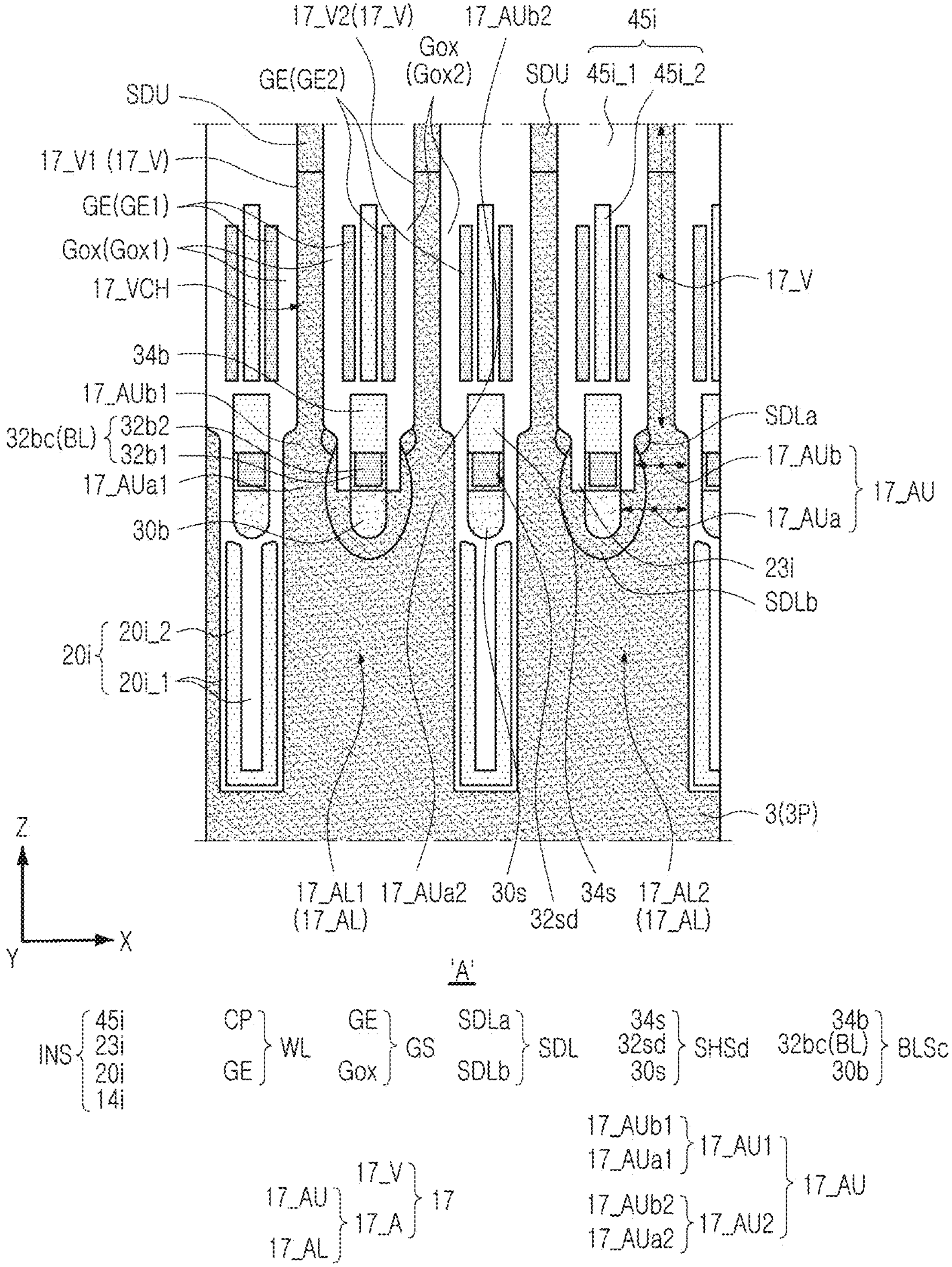
FIG. 11 is a partially enlarged cross-sectional view conceptually illustrating a variation of some elements of a semiconductor device according to an embodiment of inventive concepts.
Figure 12:
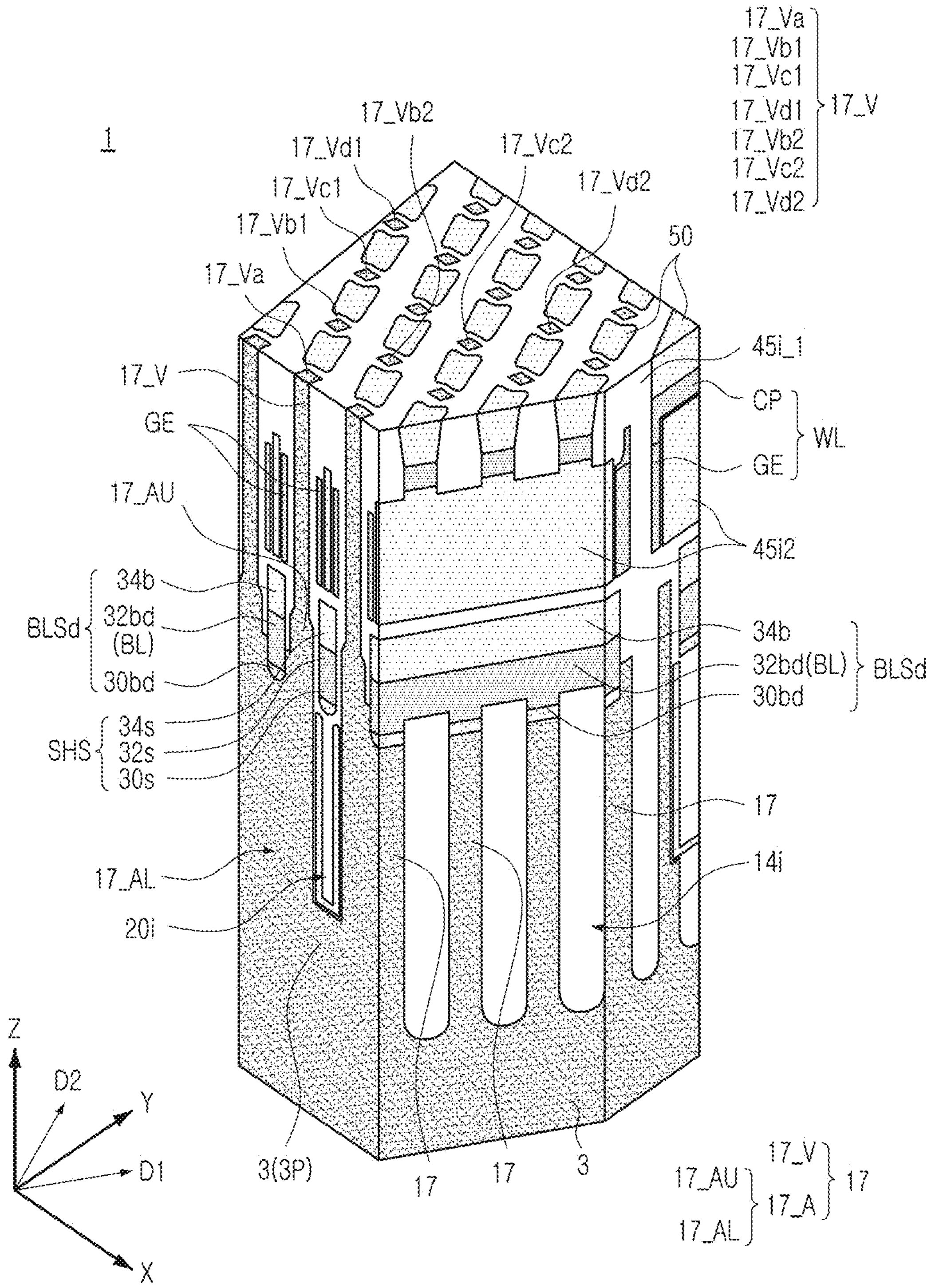
FIG. 12 is a perspective view conceptually illustrating a variation of some elements of a semiconductor device according to an embodiment of inventive concepts.

In FIGS. 6 to 12, FIGS. 6, 7, 8, 9, 10 and 11 may illustrate elements that can be modified or replaced in the partially enlarged cross-sectional view of FIG. 2B, and FIG. 12 may illustrate elements that can be modified or replaced in the perspective view of FIG. 3A.

Figure 6:
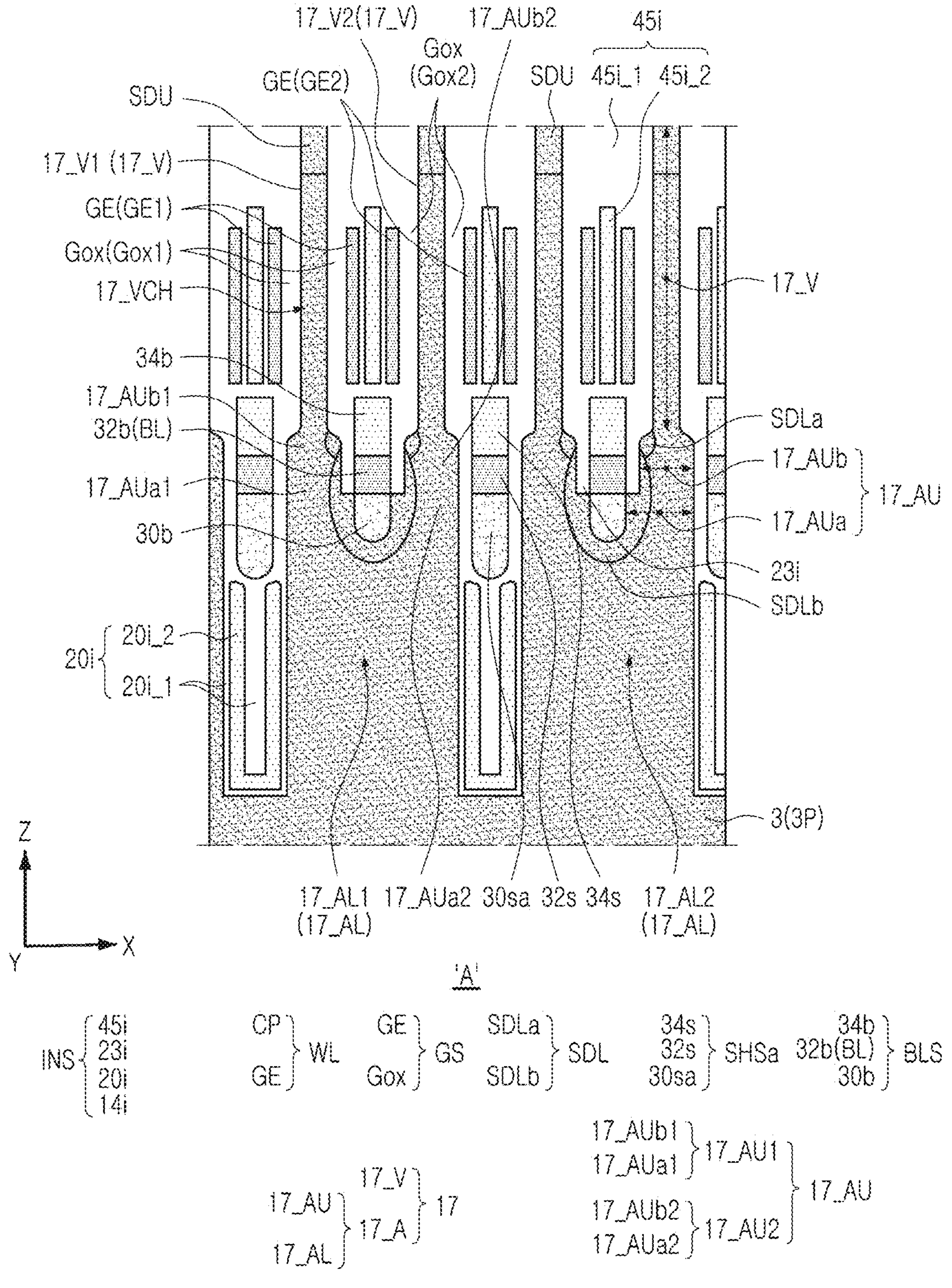
FIG. 6 is a partially enlarged cross-sectional view conceptually illustrating a variation of some elements of a semiconductor device according to an embodiment of inventive concepts.

In a modified example, referring to FIG. 6, the shield structure (SHS in FIG. 2B), which may be disposed on substantially the same level as the bit line structure (BLS in FIG. 2B) as described above, may be modified to a shield structure SHSa having a lower end disposed on a level different from that of a lower end of the bit line structure BLS. The lower end of the shield structure SHS may be disposed on a level lower than the lower end of the bit line structure BLS. For example, the first shield layer (30*s* in FIG. 2B) as described above may be modified to a first shield layer 30*sa* having a lowered lower end. The first shield layer (30*s* in FIG. 2B) as described above may be modified to a first shield layer 30*sa* having an increased vertical thickness. Accordingly, the shield structure SHSa may include the first shield layer 30*sa*, the second shield layer 32*s*, and the shield capping layer 34*s* sequentially stacked, and the lower end of the first shield layer 30*sa* may be disposed on a level lower than the lower end of the bit line contact layer 30*b* of the bit line structure BLS.

A vertical thickness of the shield structure SHSa may be greater than a vertical thickness of the bit line structure BLS, where the vertical thickness may be defined as the distance between a lower surface and an upper surface thereof.

Figure 7:
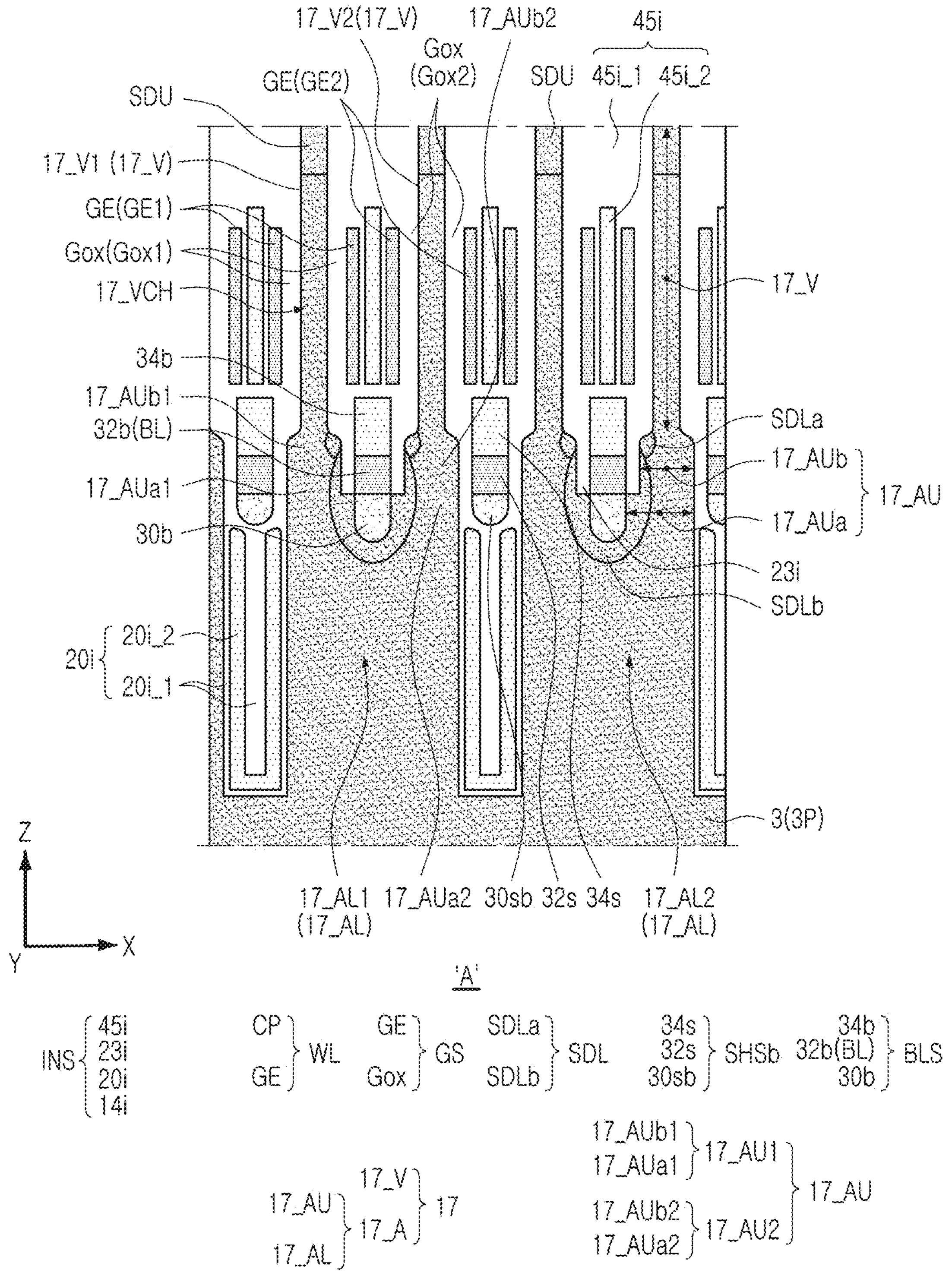
FIG. 7 is a partially enlarged cross-sectional view conceptually illustrating a variation of some elements of a semiconductor device according to an embodiment of inventive concepts.

In a modified example, referring to FIG. 7, the shield structure (SHS in FIG. 2B), which may be disposed on substantially the same level as the bit line structure (BLS in FIG. 2B) as described above, may be modified to a shield structure SHSb having a lower end disposed on a level higher than the lower end of the bit line structure BLS. For example, the first shield layer (30*s* in FIG. 2B) as described above may be modified to a first shield layer 30*sb* having a raised lower end. The first shield layer (30*s* in FIG. 2B) as described above may be modified to a first shield layer 30*sb* having a reduced vertical thickness. Accordingly, the shield structure SHSb may include the first shield layer 30*sb*, the second shield layer 32*s*, and the shield capping layer 34*s* sequentially stacked, and the lower end of the first shield layer 30*sb* may be disposed on a level higher than the lower end of the bit line contact layer 30*b* of the bit line structure BLS. A vertical thickness of the shield structure SHSb may be less than a vertical thickness of the bit line structure BLS.

Figure 8:
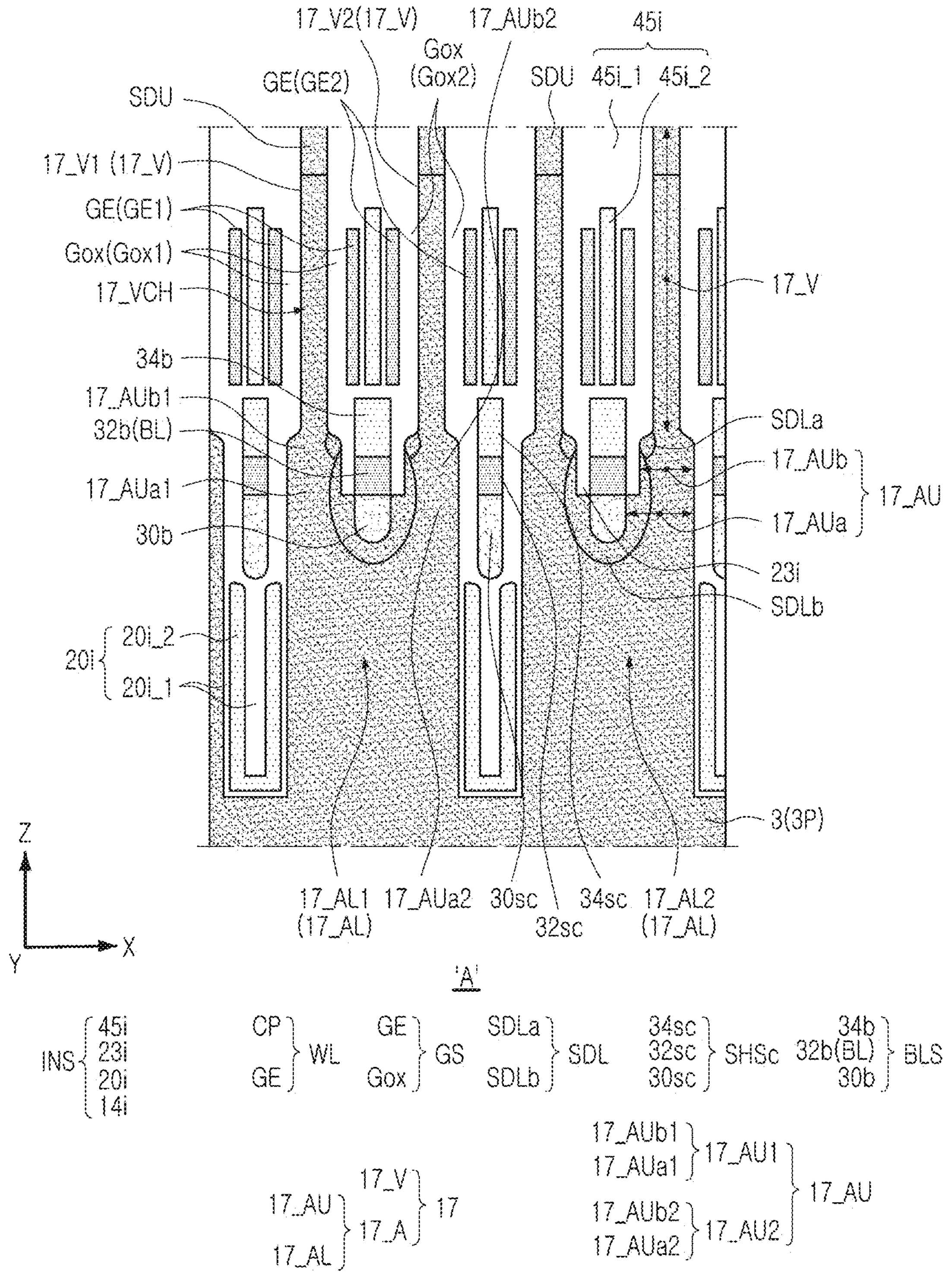
FIG. 8 is a partially enlarged cross-sectional view conceptually illustrating a variation of some elements of a semiconductor device according to an embodiment of inventive concepts.

In a modified example, referring to FIG. 8, the shield structure (SHS in FIG. 2B), which may have substantially the same width as the bit line structure (BLS in FIG. 2B) as described above, may be modified to a shield structure SHSc having a width different from that of the bit line structure BLS. For example, the shield structure SHSc may have a width less than a width of the bit line structure BLS. For example, the first shield layer (30*s* in FIG. 2B), the second shield layer (32*s* in FIG. 2B), and the shield capping layer 34*s* as described above may be modified to a first shield layer 30*sc*, a second shield layer 32*sc* and a shield capping layer 34*sc* having reduced widths, respectively. Accordingly, the shield structure SHSc may include the first shield layer 30*sc*, the second shield layer 32*sc*, and the shield capping layer 34*sc* sequentially stacked.

In one example, a lower end of the shield structure SHSc may be disposed on substantially the same level as a lower end of the bit line structure BLS.

In another example, the lower end of the shield structure SHSc may be disposed on a different level from that of the lower end of the bit line structure BLS. For example, similar to the shield structure SHSa in FIG. 6, the lower end of the shield structure SHSc may be disposed on a level than lower than the lower end of the bit line structure BLS.

Figure 9:
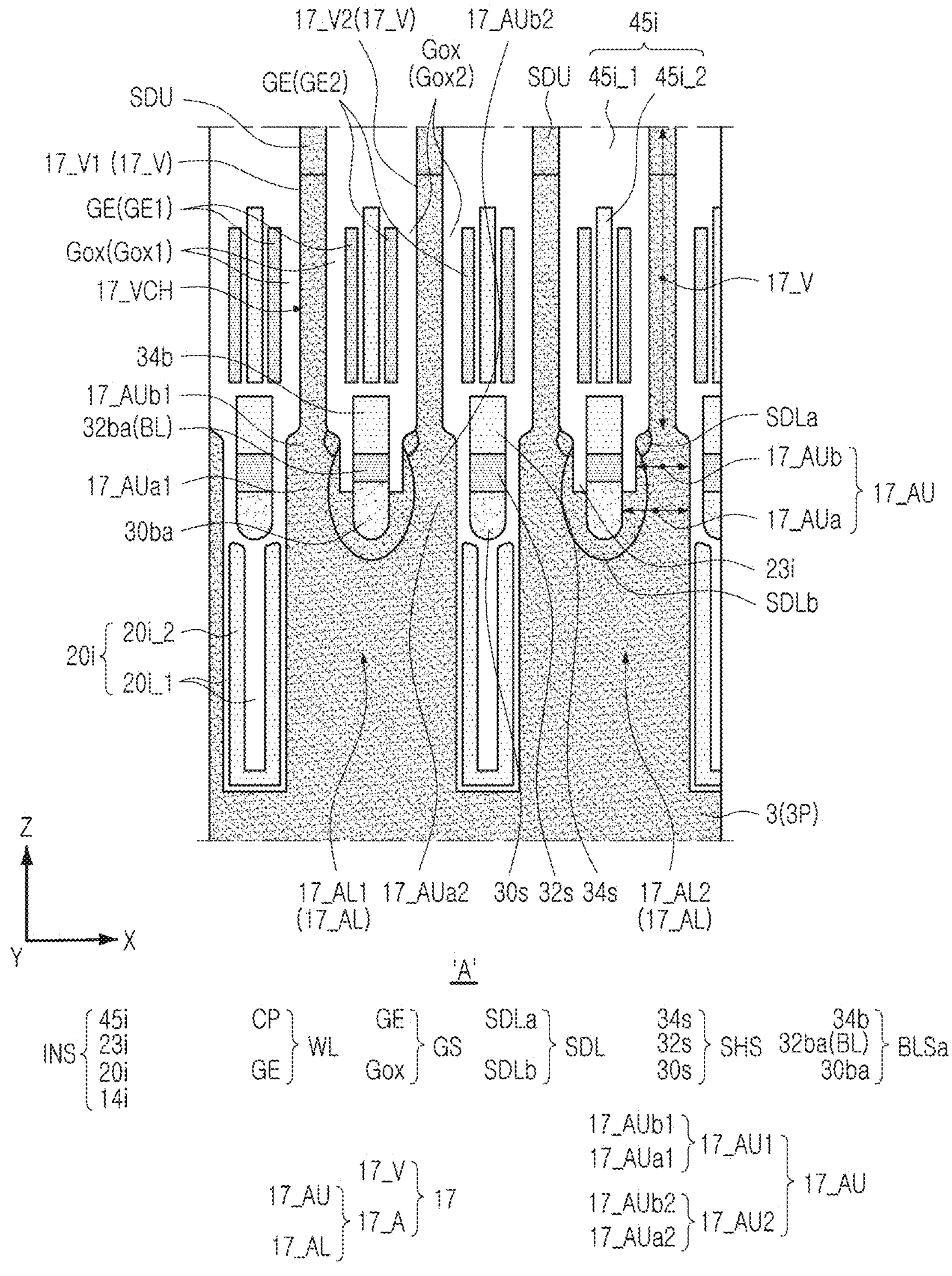
FIG. 9 is a partially enlarged cross-sectional view conceptually illustrating a variation of some elements of a semiconductor device according to an embodiment of inventive concepts.

In a modified example, referring to FIG. 9, the bit line structure (BLS in FIG. 2B) including the bit line contact layer (30*b* in FIG. 2*b*) having an upper surface positioned at substantially the same level as upper ends of the lower portions 17_AUa as described above may be modified to a bit line structure BLSa including a bit line contact layer 30*ba* having an upper surface positioned at a level higher than the upper ends of the lower portions 17_AUa. Accordingly, the bit line (32*b* in FIG. 2B) as described above may be modified to a bit line 32*ba* positioned at a level than higher the lower portions 17_AUa and spaced apart from the lower portions 17_AUa. Accordingly, the bit line structure BLSa may include the bit line contact layer 30*ba*, the bit line 32*ba*, and the bit line capping layer 34*b*.

In a modified example, referring to FIG. 10, the bit line structure (BLS in FIG. 2B) including the bit line contact layer (30*b* in FIG. 2*b*) having an upper surface positioned at substantially the same level as upper ends of the lower portions 17_AUa as described above may be modified to a bit line structure BLSb including a bit line contact layer 30*bb* having an upper surface positioned at a level lower than the upper ends of the lower portions 17_AUa. Accordingly, the bit line (32*b* in FIG. 2B) as described above may be modified to a bit line 32*bb* positioned at a level than lower the lower portions 17_AUa and contacting the lower portions 17_AUa. Accordingly, the bit line structure BLSb may include the bit line contact layer 30*bb*, the bit line 32*bb*, and the bit line capping layer 34*b*.

In a modified example, referring to FIG. 11, the bit line structure (BLS in FIG. 2B) including the bit line (32*b* in FIG. 2B) as described above may modified to a bit line structure BLSc including a bit line 32*bc* including at least two material layers, and the shield structure (SHSd in FIG. 2) including the second shield layer (32*s* in FIG. B) as described above may be modified to a shield structure SHSd including a second shield layer 32*sd* including at least two material layers.

Each of the bit line 32*bc* and the second shield layer 32*sd* may include a first material layer 32*b*2 and a second material layer 32*b*1 covering a side surface and a bottom surface of the first material layer 32*b*2. The first material layer 32*b*2 may comprise a metal material such as W and the like, and the second material layer 32*b*1 may include a metal nitride such as TiN and the like.

In a modified example, referring to FIG. 12, the bit line structure (BLS of FIG. 3A) including the bit line contact layer (30*b* in FIG. 3A) having a line shape extending in the first direction D1 as described above may be modified to a bit line structure BLSd including bit line contact layers 30*bd* arranged in the first direction D1 and spaced apart from each other and.

The bit line (32*b* in FIG. 3A) having a lower surface spaced apart from the first isolation region 14*i* as described above may be modified to a bit line 32*bd* having a lower surface contacting the first isolation region 14*i*. Accordingly, the bit line structure BLSd may include the bit line contact layers 30*bd*, the bit line 32*bd*, and the bit line capping layer 34*b*.

Figure 13:
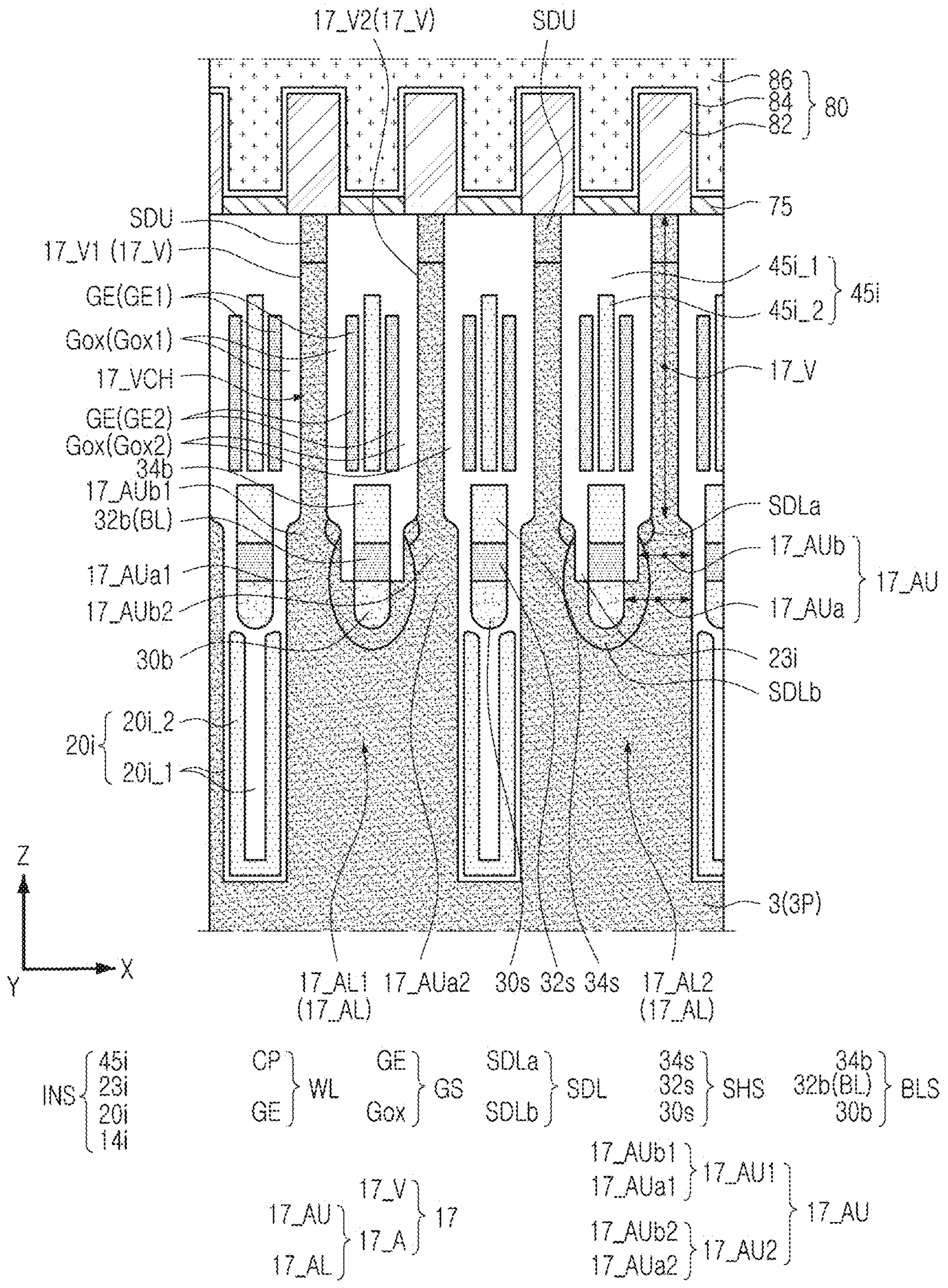
FIG. 13 is a partially enlarged cross-sectional view illustrating a semiconductor device according to an embodiment of inventive concepts.
Figure 14:
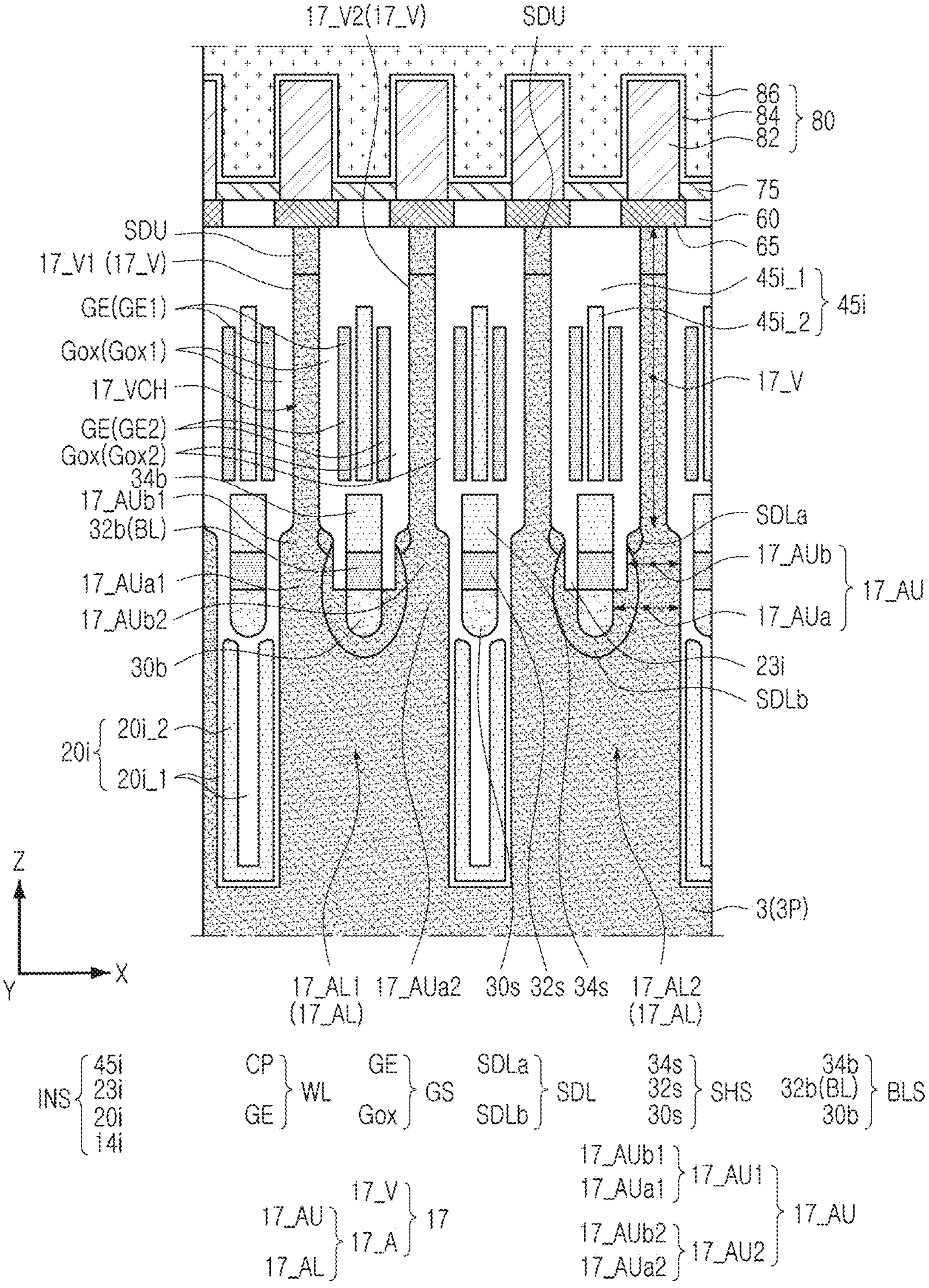
FIG. 14 is a partially enlarged cross-sectional view illustrating a semiconductor device according to an embodiment of inventive concepts.

The embodiment described with reference to FIGS. 1 to 5B, the embodiment described with reference to FIG. 6, the embodiment described with reference to FIG. 7, the embodiment described with reference to FIG. 8, the embodiment described with reference to FIG. 9, the embodiment described with reference to FIG. 10, the embodiment described with reference to FIG. 11, and the embodiment described with reference to FIG. 12 may further include an information storage structure. Embodiments further including such an information storage structure will be described with reference to FIGS. 13 and 14, respectively. FIGS. 13 and 14 illustrate cross-section structures further including an information storage structure in the cross-section structure in FIG. 2B, but embodiments are not limited thereto. For example, the embodiment described with reference to FIG. 6, the embodiment described with reference to FIG. 7, the embodiment described with reference to FIG. 8, the embodiment described with reference to FIG. 9, the embodiment described with reference to FIG. 10, the embodiment described with reference to FIG. 11, and the embodiment described with reference to FIG. 12 may further include the information storage structures described with reference to FIGS. 13 and 14, respectively.

In one example, referring to FIG. 13, an etch stop layer 75 may be disposed on the vertical active pillars 17_V and the upper insulating region 45*i*. The etch stop layer 75 may be formed of an insulating material. First electrodes 82 penetrating the etch stop layer 75 and electrically connected to the upper source/drain regions SDU in the vertical active pillars 17_V, a dielectric layer 84 covering the first electrodes 82 and the etch stop layer 75, and a second electrode 86 on the dielectric layer 84 may be disposed. The first electrodes 82, the dielectric layer 84, and the second electrode 86 may constitute an information storage structure 80.

In one example, the information storage structure 80 may be a DRAM capacitor. The dielectric layer 84 may comprise a high-κ dielectric, a silicon oxide, a silicon nitride, a silicon oxynitride, or a combination thereof.

In another example, the information storage structure 80 may be a structure storing information of a memory other than a DRAM. For example, the information storage structure 80 may be a capacitor of a ferroelectric memory (FeRAM) disposed between the first and second electrodes 82 and 86 and including a dielectric layer 84 having a ferroelectric layer. For example, the dielectric layer 84 may include a ferroelectric layer capable of recording data using a polarization state.

In one example, referring to FIG. 14, landing pads 65 and an insulating layer 60 may be disposed on the vertical active pillars 17_V and the upper insulating region 45*i*. The landing pads 65 may be electrically connected to the upper source/drain regions SDU in the vertical active pillars 17_V. The landing pads 65 may be formed of a conductive material. The insulating layer 60 may surround side surfaces of the landing pads 65. An upper surface of the insulating layer 60 may be coplanar with upper surfaces of the landing pads 65.

An etch stop layer 75 may be disposed on the landing pads 65 and the insulating layer 60. The etch stop layer 75 may be formed of an insulating material. First electrodes 82 penetrating the etch stop layer 75 and electrically connected to the landing pads 65, a dielectric layer 84 covering the first electrodes 82 and the etch stop layer 75, and a second electrode 86 on the dielectric layer 84 may be disposed. The first electrodes 82 may be electrically connected to the upper source/drain regions SDU in the vertical active pillars 17_V via the landing pads 65. The first electrodes 82, the dielectric layer 84, and the second electrode 86 may constitute an information storage structure 80. The information storage structure 80 may be substantially the same as the information storage structure 80 of FIG. 13.

Next, with reference to FIGS. 15A to 18C, an illustrative example of a method of forming a semiconductor device according to an embodiment of inventive concepts will be described. In FIGS. 15A to 18C, FIGS. 15A, 16A, 17A and 18A are perspective views corresponding to the perspective view of FIG. 2A, FIGS. 15B, 16B, 17B and 18B are perspective views corresponding to the perspective view of FIG. 3A, and FIGS. 15C, 16C, 17C and 18C are perspective views corresponding to the perspective view of FIG. 4.

Figure 15A:
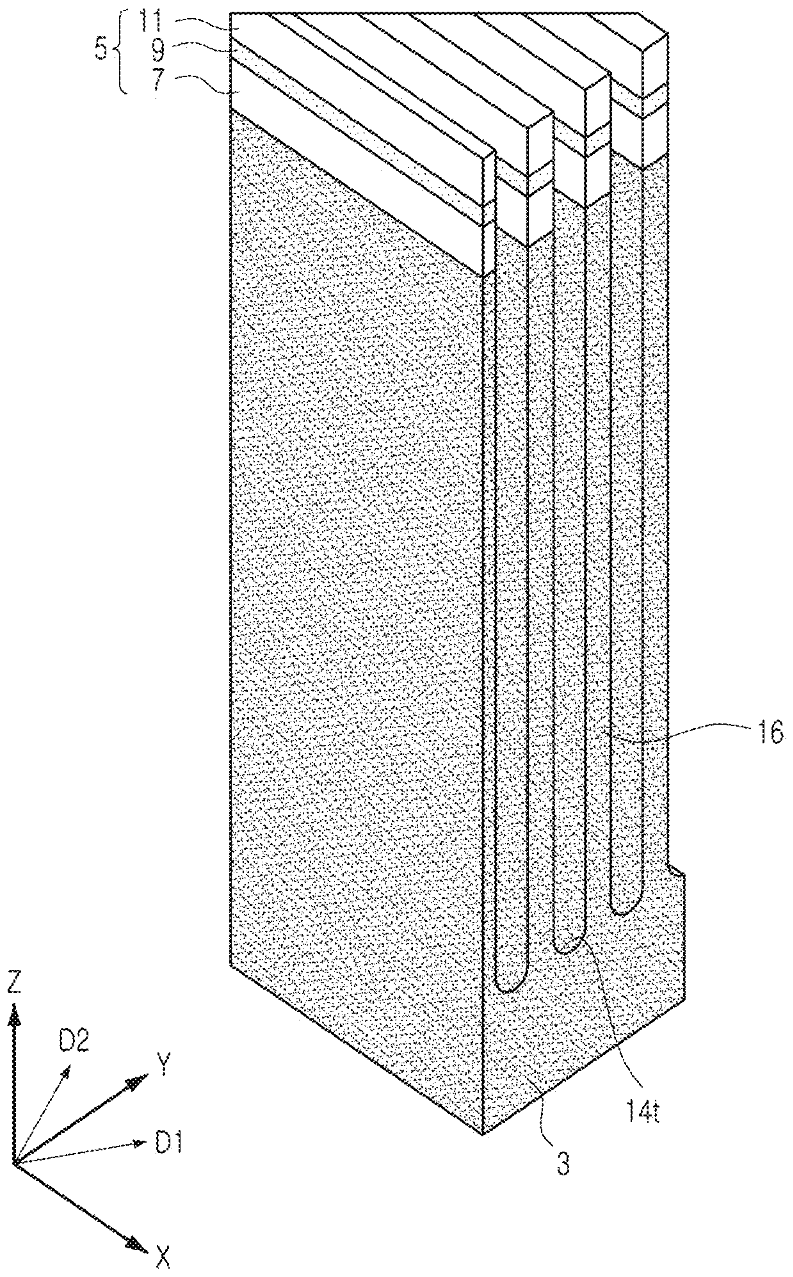
FIGS. 15A to 18C are the drawings conceptually illustrating an illustrative example of a method for forming a semiconductor device according to an embodiment of inventive concepts.
Figure 15B:
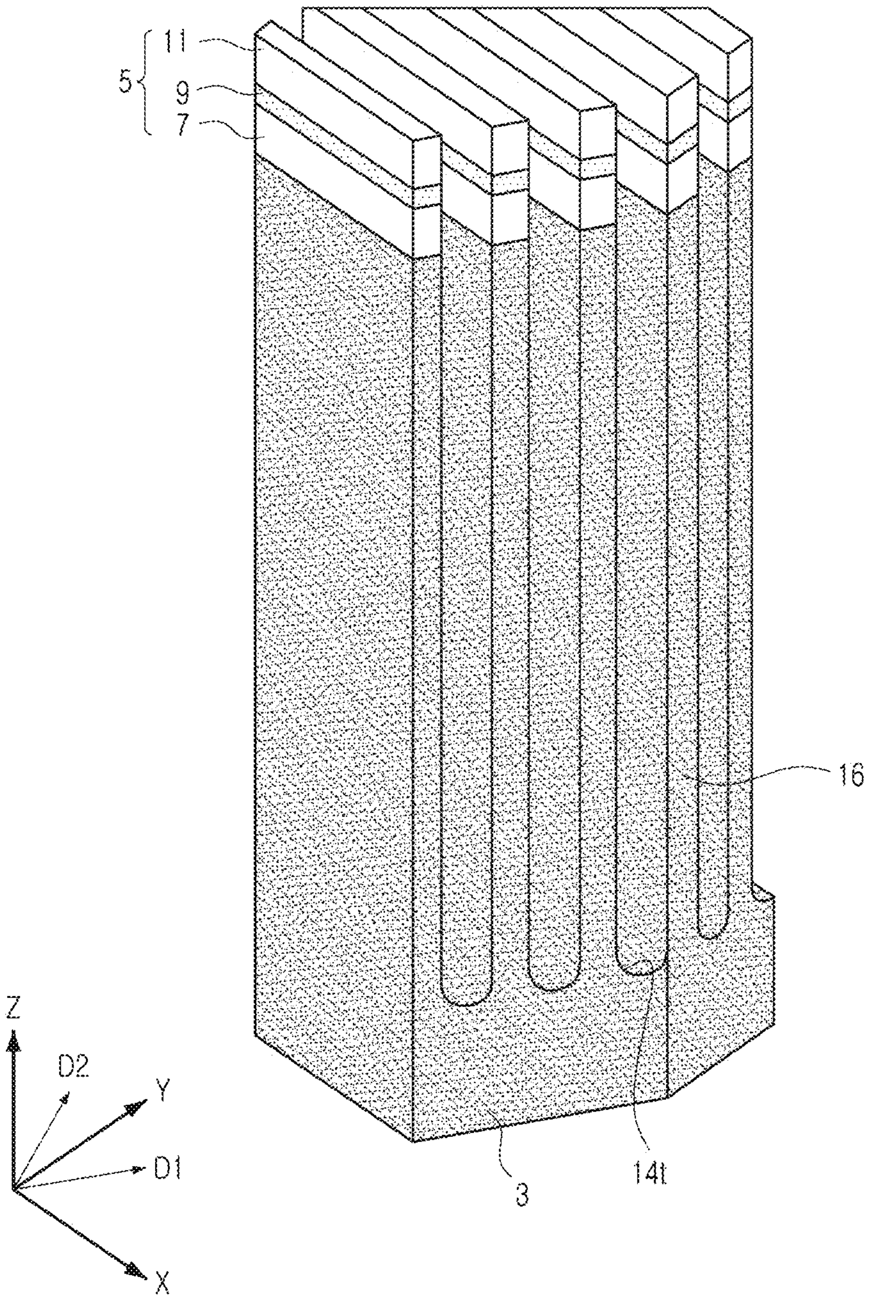
Figure 15C:
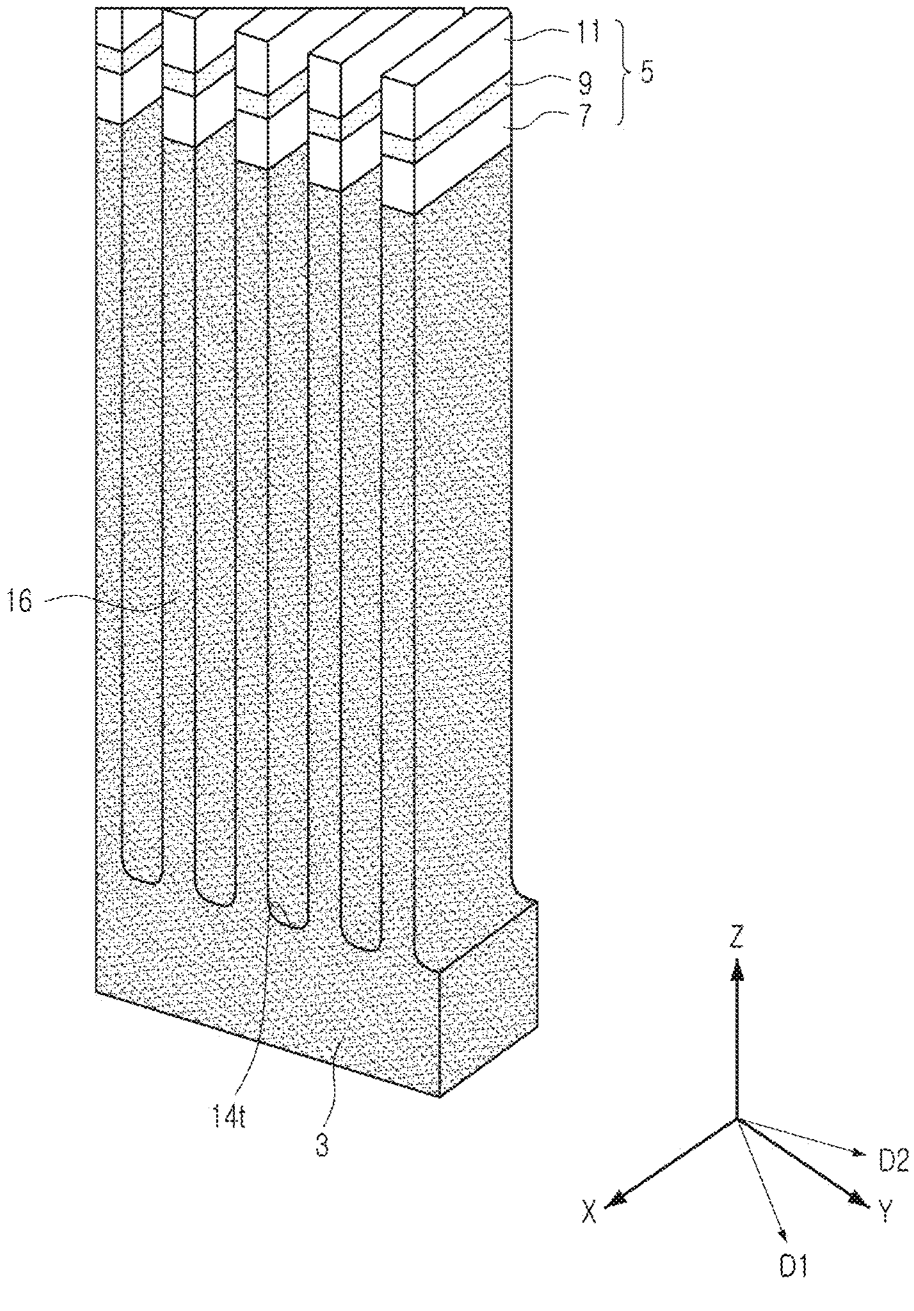

Referring to FIGS. 15A, 15B, and 15C, a mask structure 5 may be formed on a substrate 3. The substrate 3 may be a semiconductor substrate. The mask structure 5 may include a first mask layer 7, a second mask layer 9, and a third mask layer 11 sequentially stacked. The second mask layer 9 may be formed of a material different from those of the first and third mask layers 7 and 11. For example, the second mask layer 9 may comprise a silicon nitride, and the first and third mask layers 7 and 11 may comprise a silicon oxide.

The substrate 3 may be etched in an etching process using the mask structure 5 as an etching mask so as to form first element isolation trenches 14*t*.

Each of the first element isolation trenches 14*t* may have a line shape extending in the third direction X. Preliminary active regions 16 may be defined by the first element isolation trenches 14*t*. Each of the preliminary active regions 16 may have a line shape extending in the third direction X.

Figure 16A:
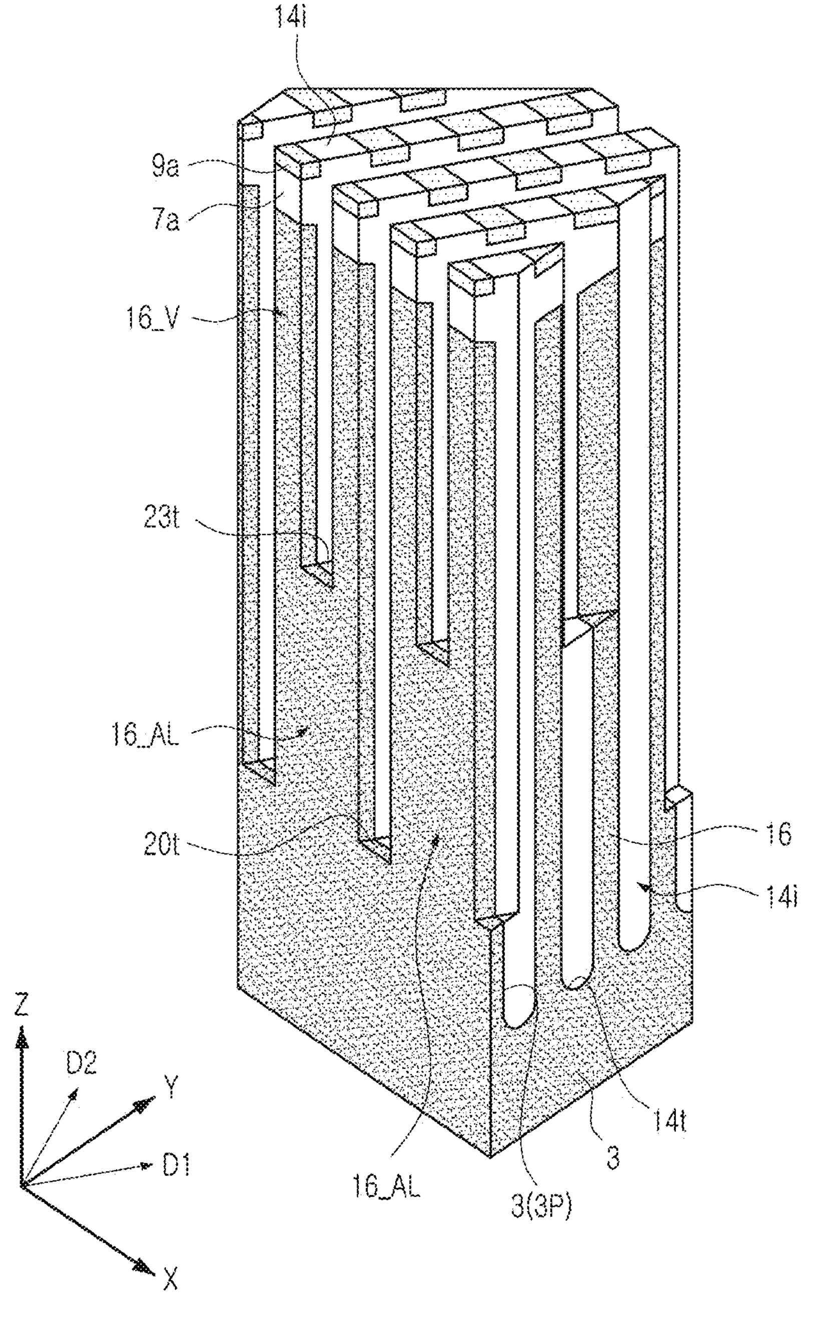
Figure 16B:
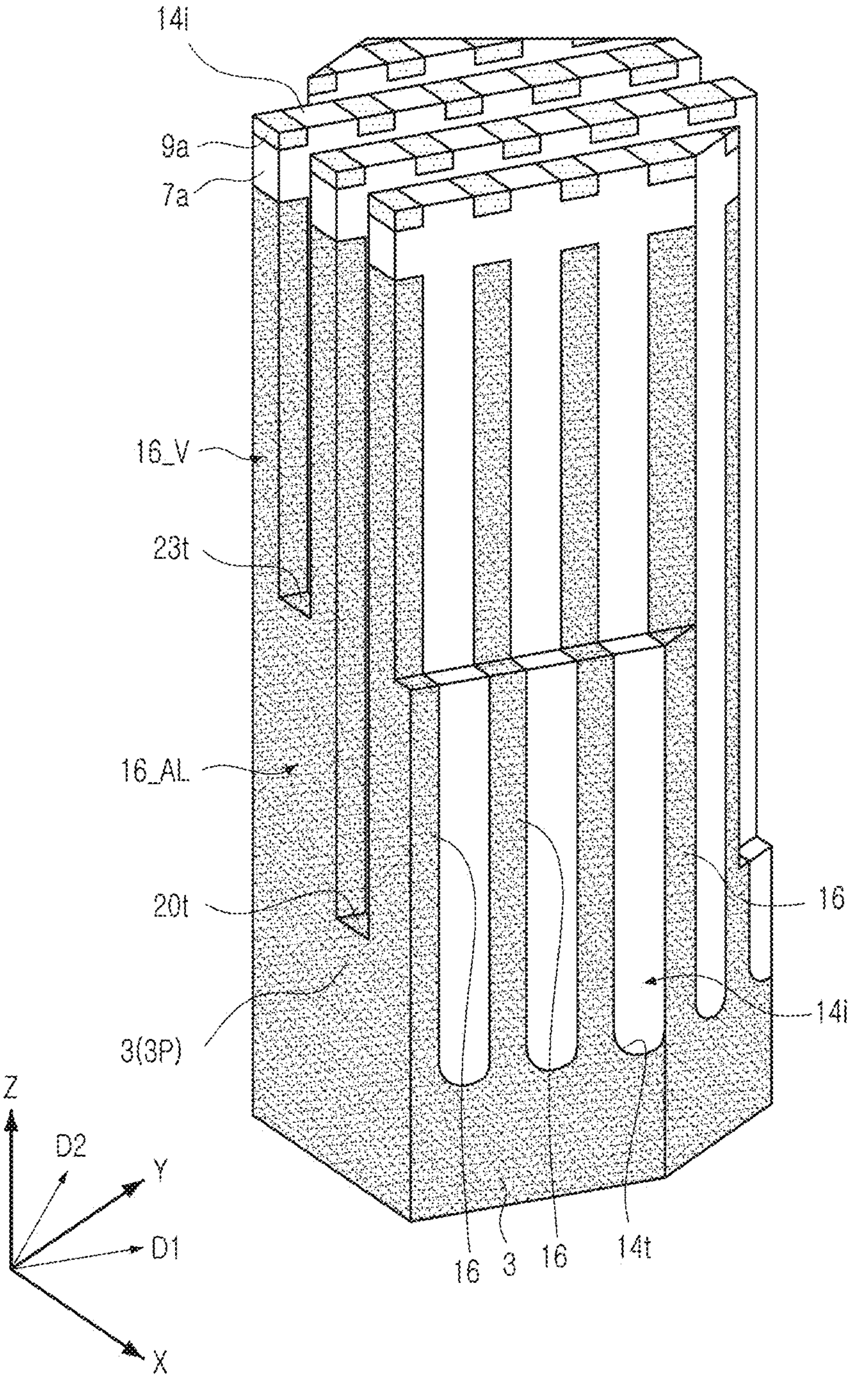
Figure 16C:
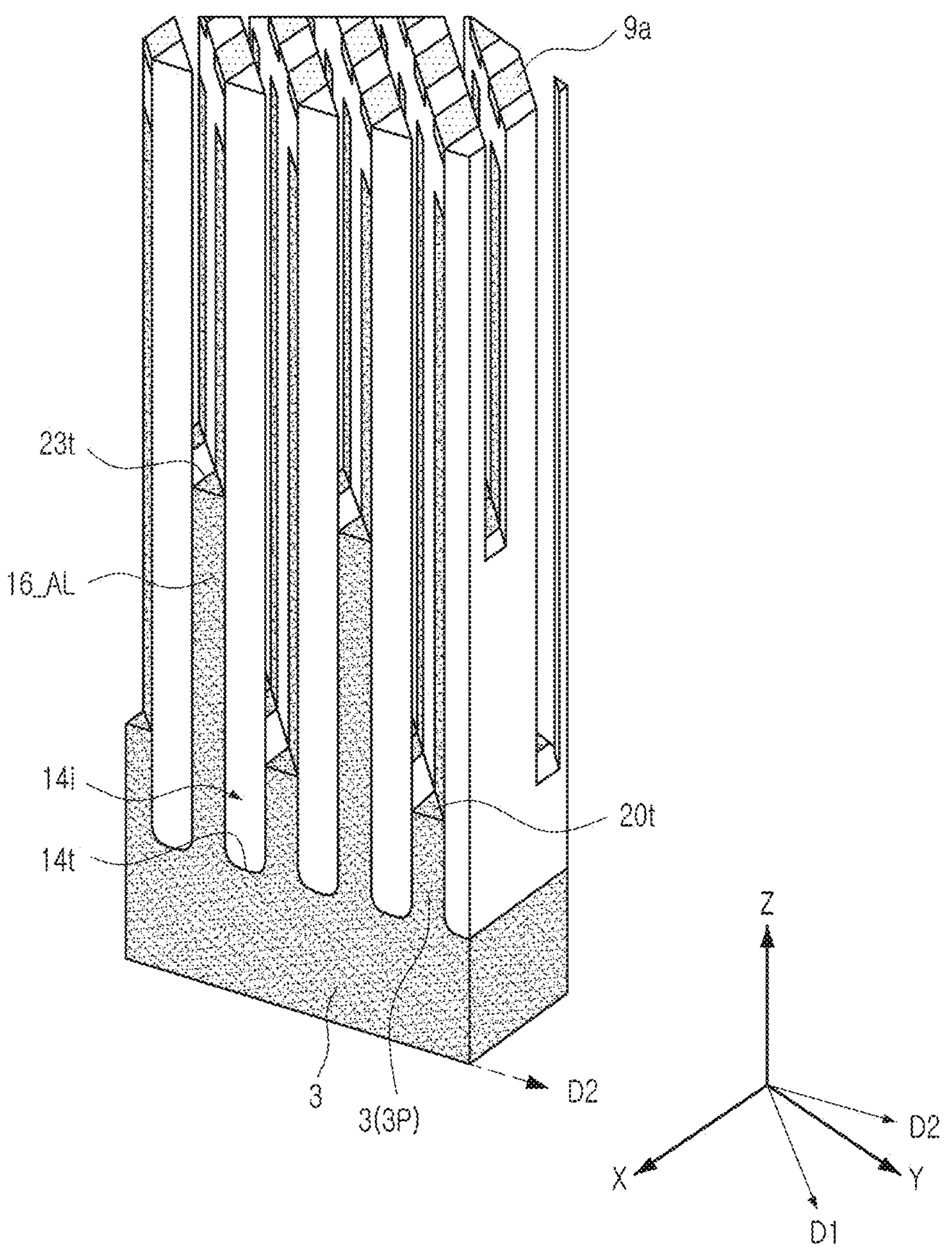

Referring to FIGS. 16A, 16B, and 16C, first isolation regions 14*i* filling the first element isolation trenches 14*t* may be formed. The first isolation regions 14*i* may have a line shape extending in the third direction X. Forming the first isolation regions 14*i* may include forming an insulating material for filling the first element isolation trenches 14*t*, and planarizing the insulative material until the second mask layer (9 in FIGS. 15A, 15B, and 15C) is exposed. The insulating material may be formed of a silicon oxide or low-κ dielectric. While forming the first isolation region 14*i*, the third mask layer (11 in FIGS. 15A, 15B, and 15C) may be removed.

Trenches 20*t* and 23*t* extending in a direction intersecting the first and second mask layers (7 and 9 in FIGS. 15A, 15B, and 15C), the first isolation regions 14*i*, and the preliminary active regions 16 may be formed. The trenches 20*t* and 23*t* may include second element isolation trenches 20*t* having a first depth and bit line trenches 23*t* having a second depth less than the first depth. Each of the trenches 20*t* and 23*t* may have a line shape extending in the first direction D1. Bottom surfaces of the second element isolation trenches 20*t* may be formed at a level lower than bottom surfaces of the bit line trenches 23*t*.

The substrate 3 may be defined as having an upper surface at a height level of lower ends of the first element isolation trenches 14*t*.

In one example, when lower ends of the second element isolation trenches 20*t* are formed at a level higher than the lower ends of the first element isolation trenches 14*t*, the substrate 3 may further include substrate protruding regions 3P positioned under the lower active regions 16_AL and at a level higher than the lower ends of the first element isolation trenches 14*t*.

In another example, when the lower ends of the second element isolation trenches 20*t* are formed at the same level as the lower ends of the first element isolation trenches 14*t*, the substrate protruding regions 3P may be omitted.

The second element isolation trenches 20*t* and the bit line trenches 23*t* may be alternately and repeatedly arranged in a width direction of the trenches 20*t* and 23*t*.

The first and second mask layers 7 and 9 may be formed as first and second mask patterns 7*a* and 9*a* by the trenches 20*t* and 23*t*. By the trenches 20*t* and 23*t*, each of the preliminary active regions 16 may be formed to include a preliminary lower active region 16_AL, and preliminary vertical active pillars (16_V) extending upwardly from the preliminary lower active region 16_AL and spaced apart from each other by the bit line trench 23*t*.

Figure 17A:
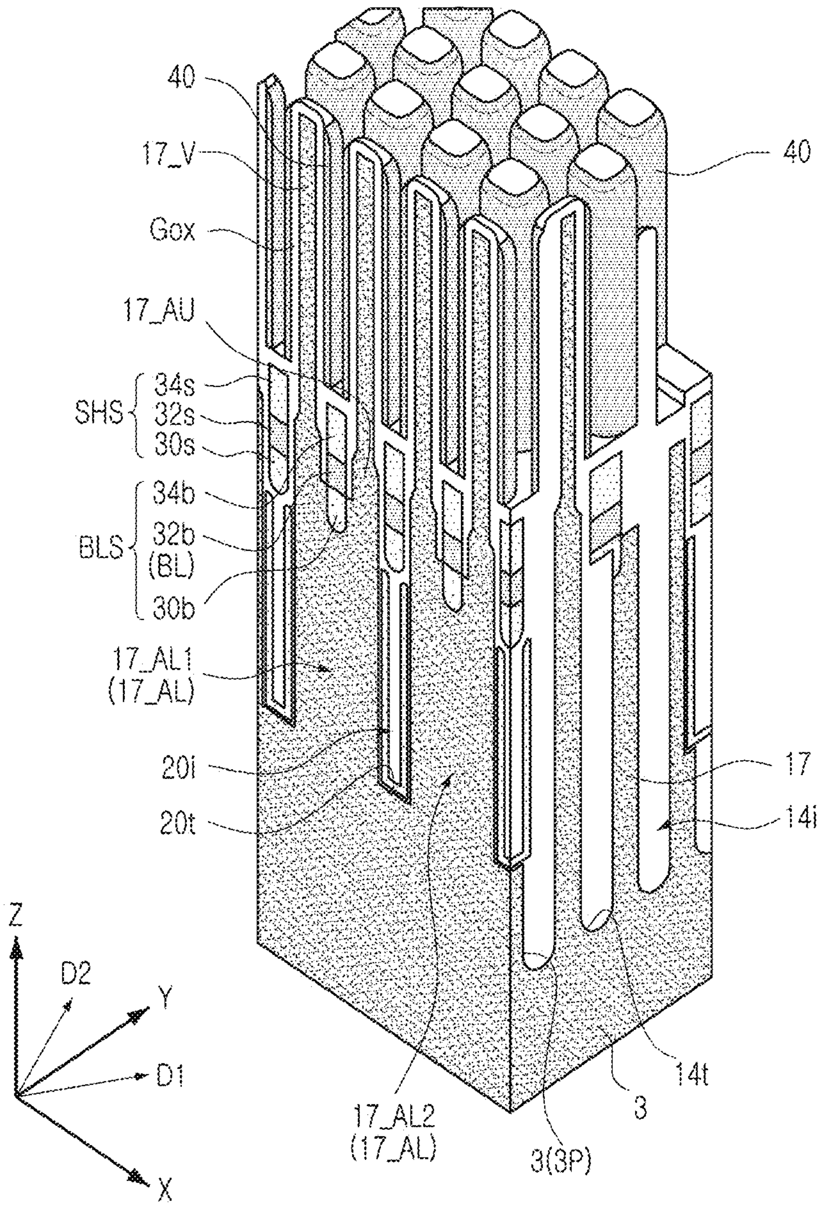
Figure 17B:
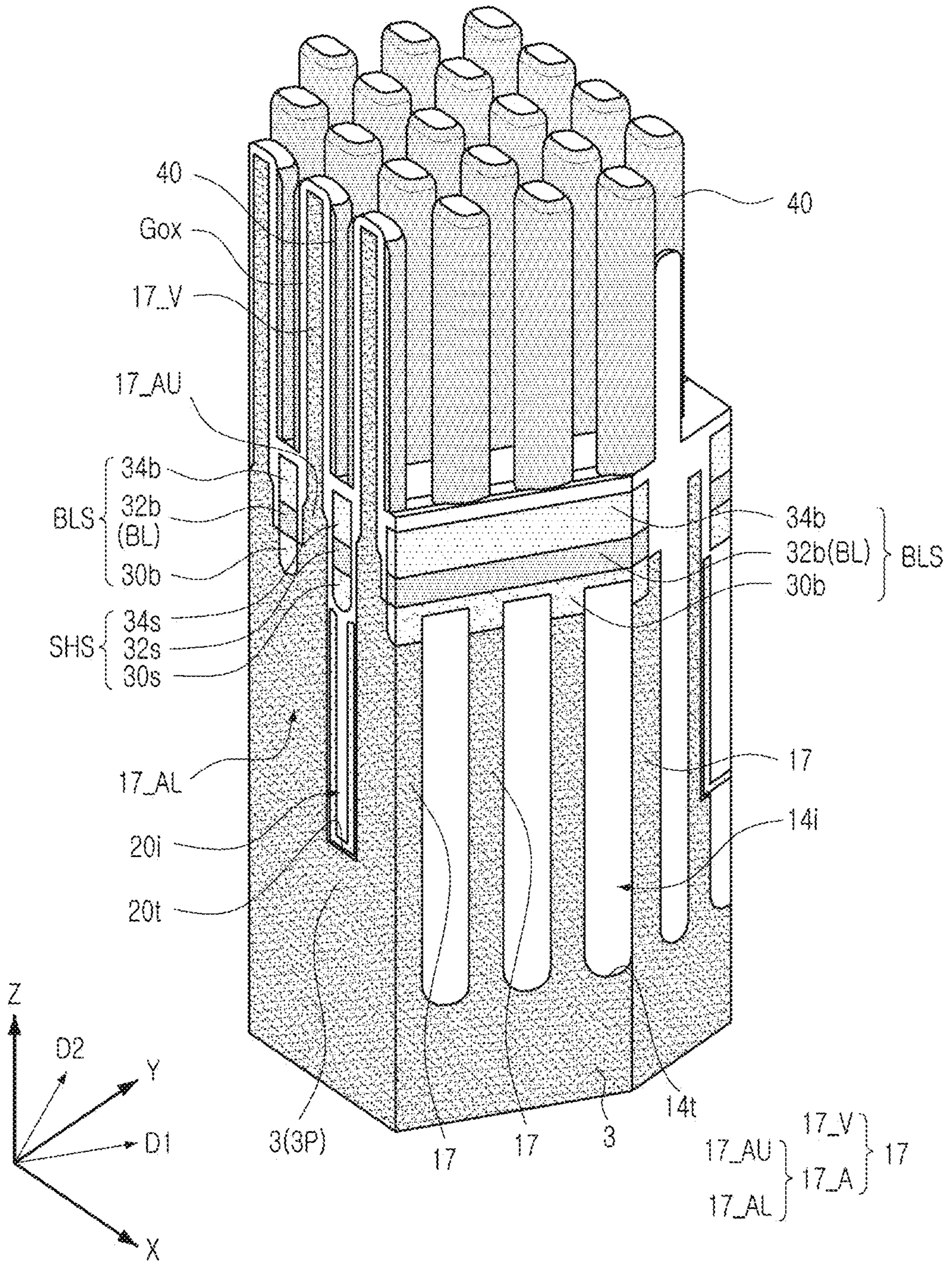
Figure 17C:
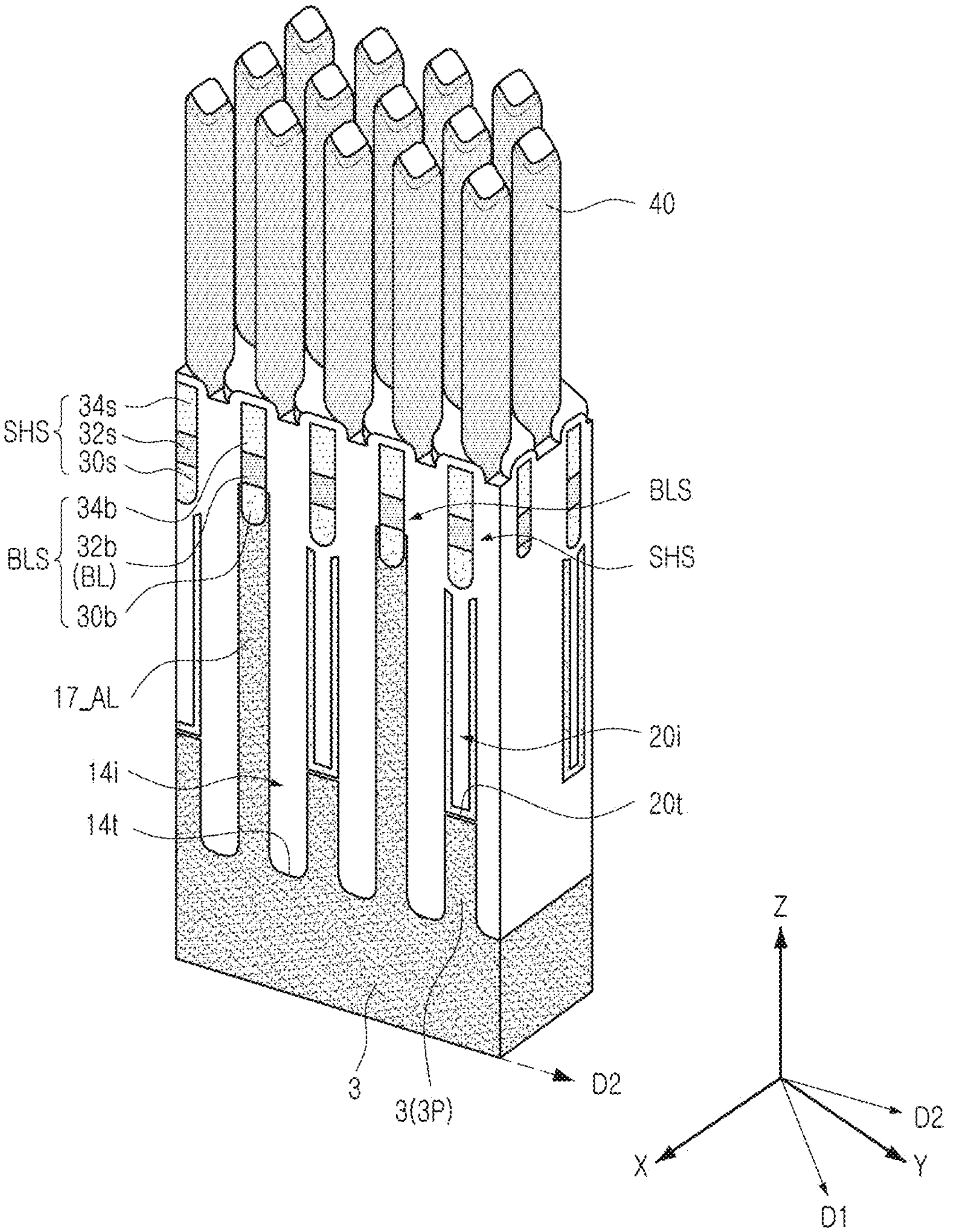

Referring to FIGS. 17A, 17B, and 17C, second isolation regions 20*i* partially filling the second element isolation trenches 20*t* may be formed.

A first material layer conformally covering inner walls of the trenches 20*t* and 23*t* may be formed, a second material layer may be conformally formed on the first material layer, a third material layer filling the trenches 20*t* and 23*t* may be formed on the second material layer, the third material may be partially etched using the second material layer as an etch mask so as to be completely removed in the bit line trench 23*t* and remain in the second element isolation trench 20*t*, the second material layer may be selectively etched in an isotropic etching process, and the first material layer is anisotropically etched so as to form the first material layer remaining on a side surface of the bit line trench 23*t*, and form a contact recess 26 by partially etching the lower active region (16_AL in FIGS. 16A, 16B and 16C) below the bit line trench 23*t*.

Subsequently, the following processes may be performed: a first conductive material layer may be formed and then partially etched; a second conductive material layer may be formed and then partially etched; and a capping material layer may be formed and then partially etched. Accordingly, the partially etched first conductive material layer may be formed as a bit line contact layer 30*b* filling the contact recess and a first shield layer 30*s* on the second isolation region 20*i*, the partially etched second conductive material layer may be formed as a bit line 32*b* (BL) on the bit line contact layer 30*b* and a second shield layer 32*s* on the first shield layer 30*s*, and the partially etched capping material layer may be formed as a bit line capping layer 34*b* on the bit line 32*b* (BL) and a shield capping layer 34*s* on the second shield layer 32*s*.

Accordingly, a bit line structure BLS including the bit line contact layer 30*b*, the bit line 32*b*, and the bit line capping layer 34*b* sequentially stacked, and a shield structure SHS including the first shield layer 30, the shield layer 32*s* and the shield capping layer 34*s* sequentially stacked may be simultaneously formed.

Subsequently, the insulating materials formed at a level higher than the bit line structure BLS and the shield structure SHS and remaining on side surfaces of the preliminary vertical active pillars (16_V in FIGS. 16A, 16B, and 16C) may be removed. In this case, widths of the preliminary vertical active pillars (16_V in FIGS. 16A, 16B, and 16C) may be reduced.

Accordingly, the preliminary active regions 16 may be formed as the active regions 17 described with reference to FIGS. 1 to 5B. For example, each of the active regions 17 may include upper active regions 17_AU spaced apart from each other by the bit line trench 23*t* and the contact recess on the lower active region 17_AL, and vertical active pillars 17_V extending upwardly on the active regions 17_AU may be included. The lower active region 17_AL and the upper active regions 17_AU may constitute a base active region 17_A. The vertical active pillars 17_V may be formed in a shape as shown in FIG. 3B.

Subsequently, a gate dielectric Gox conformally covering the vertical active pillars 17_V may be formed.

Subsequently, a conductive material layer may be conformally formed on the gate dielectric Gox, and the conductive material layer may be anisotropically etched to form conductive spacers 40 remaining on side surfaces of the vertical active pillars 17_V. The gate dielectric Gox may remain between the vertical active pillars 17_V and the conductive spacers 40. The conductive spacers 40 may be spaced apart from each other.

Figure 18A:
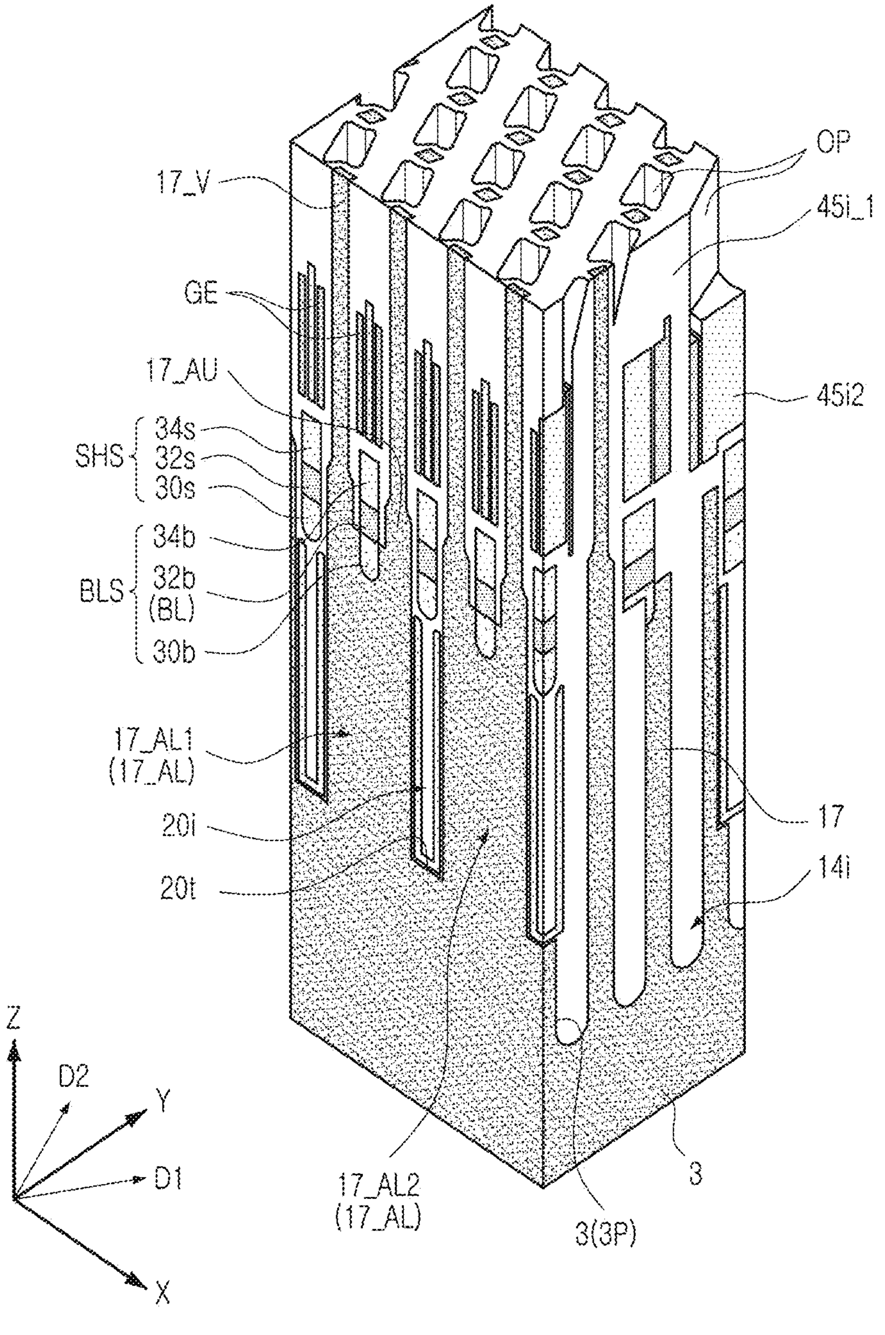
Figure 18B:
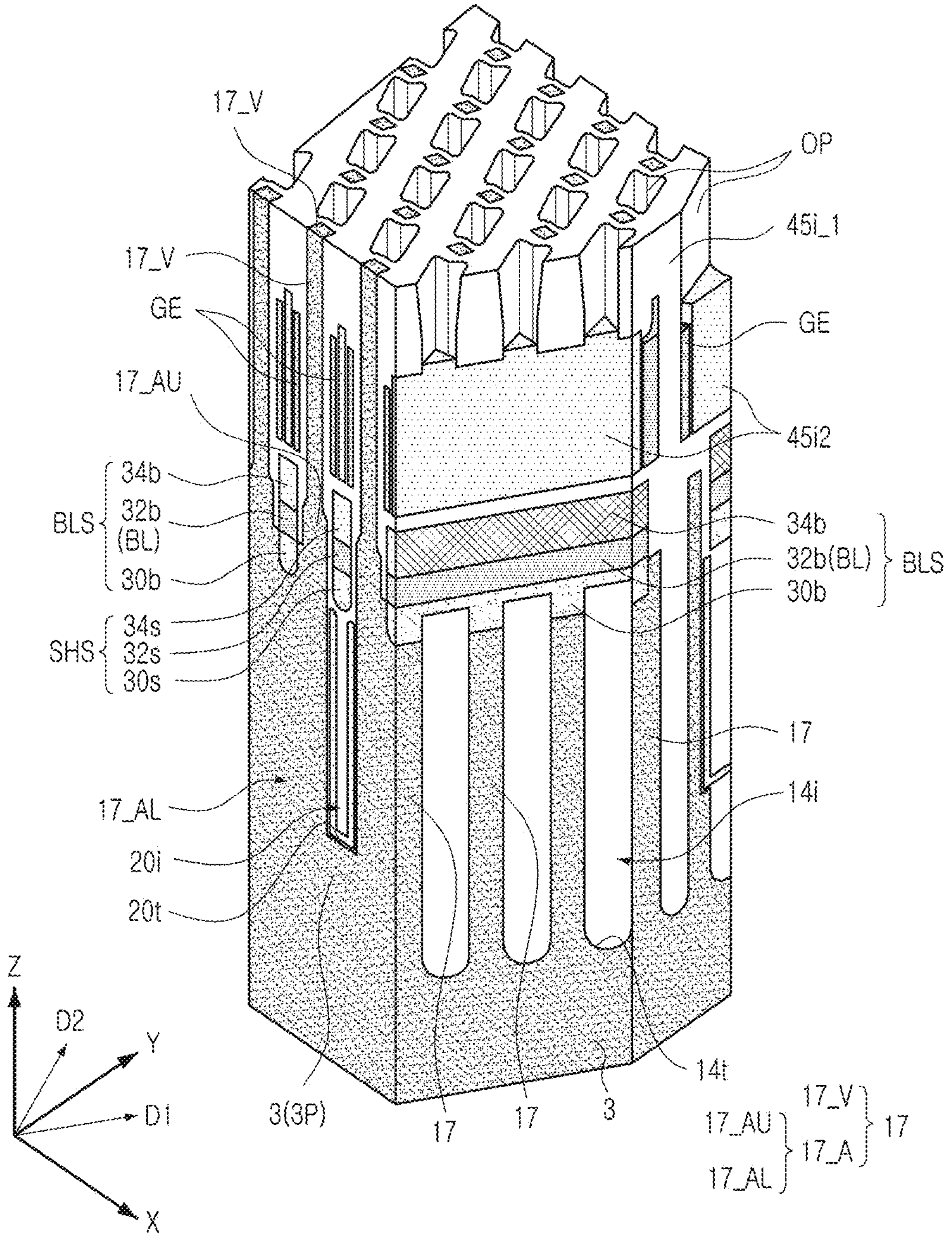
Figure 18C:
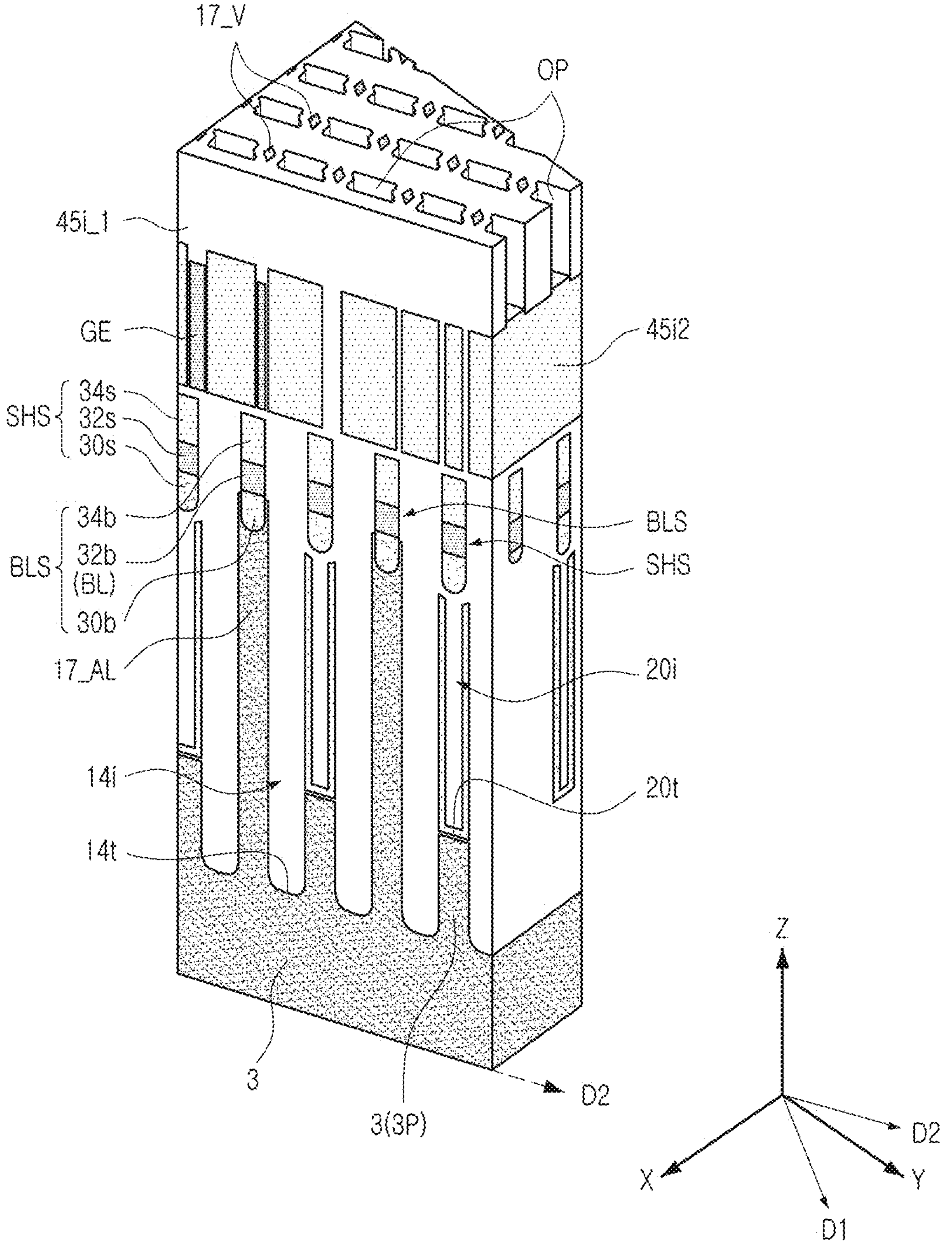

Referring to FIGS. 18A, 18B, and 18C, a first insulating layer may be conformally formed on the resultant formed up to the conductive spacers 40, a second insulating layer filled between the conductive spacers (40 in FIGS. 17A, 17B and FIG. 17C) may be formed on the first insulating layer, the second insulating layer may be partially etched, the first insulating layer partially exposed by the partially etched second insulating layer may be removed in an isotropic etching process so as to expose upper regions of the conductive spacers 40, and the exposed upper regions of the conductive spacers 40 may be removed so as to form remaining conductive spacers. Here, the remaining conductive spacers may be defined as gate electrodes GE. Accordingly, each of the gate electrodes may have a hollow column shape. The partially etched second insulating layer may be referred to with reference numeral 45$i$2.

A sacrificial material layer filling empty spaces between upper regions of the vertical active pillars 17_V may be formed, grooves extending in the second direction D2 may be formed by patterning the sacrificial material layer, and first material layer 45$i$_1 filling the grooves may be formed. Openings OP exposing at least a portion of the respective upper surfaces of the gate electrodes GE may be formed by removing the sacrificial material layer remaining between the first material layer 45$i$_1 and between the upper regions of the vertical active pillars 17_V. While the sacrificial material layer is removed, the gate dielectrics Gox covering side surfaces of the vertical active pillars 17_V may remain.

Referring again to FIGS. 1 to 5B, conductive connection patterns CP partially filling the openings (OP in FIGS. 18A, 18B, and 18C) and insulating capping patterns 50 filling the remaining portions of the openings (OP in FIGS. 18A, 18B, and 18C) on the conductive connection patterns CP may be formed.

According to embodiments, a semiconductor device having a high degree of integration may be provided. For example, the semiconductor device having a high degree of integration may include upper active regions, a bit line between the upper active regions, vertical active pillars extending upwardly from the upper active regions, and gate electrodes surrounding side surfaces of vertical channel regions of the vertical active pillars.

In an embodiment, performance of a semiconductor device may be improved by providing gate electrodes surrounding side surfaces of the vertical channel regions.

According to embodiments, shield structures capable of screening capacitive coupling between adjacent bit line structures may be provided. These shield structures may be formed of the same material as the bit line structures. By providing such shield structures, performance of a semiconductor device may be improved.

The various and beneficial advantages, features, aspects, and effects of example embodiments are not limited to the above description, and will be more easily understood in the review of the presented embodiments.

While example embodiments have been shown and described above, it will be apparent to those skilled in the art that modifications and variations could be made without departing from the scope of inventive concepts as defined by the appended claims.

What is claimed is:

1. A semiconductor device, comprising:
- a substrate including a lower active region, a first upper active region and a second upper active region protruding upwardly from the lower active region, a first vertical active pillar protruding upwardly from the first upper active region, and a second vertical active pillar protruding upwardly from the second upper active region,
  - the first upper active region and the second upper active region being spaced apart from each other;
- a bit line structure between the first upper active region and the second upper active region;
- a first gate electrode surrounding a side surface of a channel region of the first vertical active pillar;
- a second gate electrode surrounding a side surface of a channel region of the second vertical active pillar, the second gate electrode being spaced apart from the first gate electrode;
- a first gate dielectric layer between the first vertical active pillar and the first gate electrode; and
- a second gate dielectric layer between the second vertical active pillar and the second gate electrode, wherein
- the substrate includes a plurality of first element isolation trenches and a plurality of second element isolation trenches,
- a depth of the plurality of second element isolation trenches is less than a depth of the plurality of first element isolation trenches,
- the lower active region is defined by two of the plurality of second element isolation trenches crossing one of the plurality of first element isolation trenches, and
- the first upper active region and the second upper active region are defined by portions of the lower active region that are spaced apart from each other between the two of the plurality of second element isolation trenches.

2. The semiconductor device of claim 1, wherein
- the first upper active region includes a first lower portion on the lower active region and a first upper portion on the first lower portion,
- the second upper active region includes a second lower portion on the lower active region and a second upper portion on the second lower portion,
- the bit line structure includes a bit line contact layer and a bit line on the bit line contact layer,
- at least a portion of the bit line contact layer is between the first lower portion and the second lower portion, and
- at least a portion of the bit line is between the first upper portion and the second upper portion.

3. The semiconductor device of claim 2, wherein the bit line contact layer contacts the lower active region, the first lower portion, and the second lower portion.

4. The semiconductor device of claim 2, further comprising:
- an insulating structure including an insulating region, wherein
- the insulating region is between the bit line and the first upper portion, and
- the insulating region is between the bit line and the second upper portion.

5. The semiconductor device of claim 2, wherein a width of the first lower portion is greater than a width of the first upper portion.

6. The semiconductor device of claim 2, wherein a level of an upper surface of the bit line contact layer is higher than a level of the first lower portion and a level of the second lower portion.

7. The semiconductor device of claim 2, wherein a level of an upper surface of the bit line contact layer is lower than a level of the first upper portion and a level of the second upper portion.

8. The semiconductor device of claim 2, wherein
- the bit line contact layer includes silicon, and
- the bit line includes at least one of a metal and a metal nitride.

9. The semiconductor device of claim 2, wherein
- the bit line structure further includes a bit line capping layer on the bit line, and
- a level of the bit line capping layer is lower than a level of the first gate electrode and a level of the second gate electrode.

10. The semiconductor device of claim 1, wherein
- a width of the first vertical active pillar is smaller than a width of the first upper active region, and
- wherein a width of the second vertical active pillar is smaller than a width of the second upper active region.

11. The semiconductor device of claim 1, further comprising:

shield structures, wherein at least a portion of each of the shield structures is at a same level as at least a portion of the bit line structure, the shield structures include a first one of the shield structures in a first one of the two of the plurality of second element isolation trenches and a second one of the shield structures in a second one of the two of the plurality of second element isolation trenches, and the first upper active region, the second upper active region, and the bit line structure are between the first one of the shield structures and the second one of the shield structures.

12. The semiconductor device of claim 11, wherein the bit line structure includes a bit line contact layer and a bit line on the bit line contact layer, each of the shield structures includes a first shield layer and a second shield layer on the first shield layer, a material of the bit line contact layer is the same as a material of the first shield layer, and a material of the bit line is the same as a material of the second shield layer.

13. The semiconductor device of claim 11, wherein levels of lower ends of the shield structures are different from levels of a lower end of the bit line structure.

14. The semiconductor device of claim 11, wherein a width of each of the shield structures is different from a width of the bit line structure.

15. A semiconductor device, comprising:

a substrate, the substrate including a first vertical active pillar and a second vertical active pillar;

a bit line structure at a first height level on the substrate, the bit line structure extending in a first direction; and a word line structure at a second height level on the substrate, the word line structure extending in a second direction, the second height level being higher than the first height level, wherein the first vertical active pillar and the second vertical active pillar are spaced apart from each other in the second direction on the substrate, the word line structure includes a first gate electrode surrounding a side surface of a channel region of the first vertical active pillar, a second gate electrode surrounding a side surface of a channel region of the second vertical active pillar, and a conductive connection pattern connecting at least a portion of an upper surface of the first gate electrode and at least a portion of an upper surface of the second gate electrode, and the second gate electrode is spaced apart from the first gate electrode, wherein a level of an upper surface of the conductive connection pattern is lower than a level of an upper surface of the first vertical active pillar and a level of an upper surface of the second vertical active pillar.

16. The semiconductor device of claim 15, wherein the first direction and the second direction are parallel with an upper surface of the substrate, and the second direction intersects the first direction in a first oblique direction.

17. The semiconductor device of claim 15, wherein the conductive connection pattern contacts at least a portion of the upper surface of the first gate electrode and at least a portion of the upper surface of the second gate electrode.

18. The semiconductor device of claim 15, wherein the conductive connection pattern includes a horizontal portion, a first vertical portion, and a second vertical portion, a level of the horizontal portion is higher than a level of the first gate electrode and a level of the second gate electrode, the first vertical portion extends downwardly from the horizontal portion and contacts the at least a portion of the upper surface of the first gate electrode, and the second vertical portion extends downwardly from the horizontal portion and contacts the at least a portion of the upper surface of the second gate electrode.

19. The semiconductor device of claim 15, wherein the substrate includes a lower active region, a first upper active region and a second upper active region protruding upwardly from the lower active region, and a third vertical active pillar protruding upwardly from the second upper active region, the first upper active region and the second upper active region are spaced apart from each other, the bit line structure includes a bit line contact layer and a bit line on the bit line contact layer, the bit line contact layer contacts the lower active region, the first upper active region, and the second upper active region, the first vertical active pillar protrudes upwardly from the first upper active region, the first vertical active pillar and the third vertical active pillar are spaced apart from each other in a third direction, the first direction, the second direction and the third direction are parallel with an upper surface of the substrate, the second direction is a direction intersecting the first direction in a first oblique direction, the third direction is a direction intersecting the first direction in a second oblique direction, and the second oblique direction is different from the first oblique direction.

20. A semiconductor device, comprising:

a semiconductor substrate including a lower active region extending upwardly from the semiconductor substrate, a first upper active region and a second upper active region extending upwardly from the lower active region, a first vertical active pillar extending upwardly from the first upper active region, and a second vertical active pillar extending upwardly from the second upper active region, the first upper active region and the second upper active region being spaced apart from each other;

a bit line structure between the first upper active region and the second upper active region;

a first gate electrode surrounding a side surface of a channel region of the first vertical active pillar;

a second gate electrode surrounding a side surface of a channel region of the second vertical active pillar, the second gate electrode being spaced apart from the first gate electrode;

a first gate dielectric layer between the first vertical active pillar and the first gate electrode;

a second gate dielectric layer between the second vertical active pillar and the second gate electrode;

an insulating structure including isolation regions on the semiconductor substrate and on both sides of the lower active region;

shield structures on the isolation regions;

a first conductive connection pattern contacting at least a portion of an upper surface of the first gate electrode; and a second conductive connection pattern contacting at least a portion of an upper surface of the second gate electrode, wherein a level of an upper surface of the first conductive connection pattern and a level of an upper surface of the second conductive connection pattern are lower than a level of an upper surface of the first vertical active pillar and a level of an upper surface of the second vertical active pillar.

* * * * *